United States Patent
Son et al.

(10) Patent No.: US 12,501,615 B2
(45) Date of Patent: Dec. 16, 2025

(54) THREE-DIMENSIONAL SEMICONDUCTOR MEMORY DEVICE AND ELECTRONIC SYSTEM INCLUDING VERTICAL STRUCTURES AND SEED LAYER

(71) Applicant: Samsung Electronics Co., Ltd., Suwon-si (KR)

(72) Inventors: Yoonhwan Son, Seoul (KR); Minsoo Shin, Seoul (KR); Joongshik Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 665 days.

(21) Appl. No.: 17/861,573

(22) Filed: Jul. 11, 2022

(65) Prior Publication Data

US 2023/0025248 A1     Jan. 26, 2023

(30) Foreign Application Priority Data

Jul. 21, 2021   (KR) .......... 10-2021-0095996

(51) Int. Cl.
*H10B 43/27*     (2023.01)
*G11C 16/04*     (2006.01)
*H10B 43/40*     (2023.01)

(52) U.S. Cl.
CPC ......... *H10B 43/27* (2023.02); *G11C 16/0466* (2013.01); *H10B 43/40* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35;
(Continued)

(56) References Cited

U.S. PATENT DOCUMENTS 9,570,463 B1    2/2017   Zhang et al.
9,576,967 B1 *   2/2017   Kimura ................. H10B 43/10
(Continued)

FOREIGN PATENT DOCUMENTS

CN     111244098 A    6/2020
CN     112289804 A    1/2021
(Continued)

*Primary Examiner* — William B Partridge
*Assistant Examiner* — Gustavo G Ramallo
(74) *Attorney, Agent, or Firm* — Harness, Dickey & Pierce, P.L.C.

(57) ABSTRACT

A three-dimensional semiconductor memory device may include a substrate, a stack structure including interlayer dielectric layers and gate electrodes alternately and repeatedly stacked on the substrate and including a first stack structure on the substrate and a second stack structure on the first stack structure, a seed layer interposed between the first and second stack structures and extended in a horizontal direction, vertical channel structures that penetrate the stack structure and are in contact with the substrate, and a first contact plug that penetrates the stack structure and is in contact with one of the gate electrodes. The seed layer may include first and second seed patterns enclosing the vertical channel structures and the first contact plug, and the first and second seed patterns may be spaced apart from each other in the horizontal direction.

17 Claims, 22 Drawing Sheets

(58) Field of Classification Search
CPC ........ H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | |
|---|---|---|
| 10,418,374 B2 | 9/2019 | Lee et al. |
| 10,446,578 B1 | 10/2019 | Howder et al. |
| 10,651,193 B2 | 5/2020 | Xiao et al. |
| 10,804,285 B2 | 10/2020 | Komiya |
| 2009/0121271 A1* | 5/2009 | Son ........................ H10B 43/27 257/315 |
| 2009/0242967 A1* | 10/2009 | Katsumata ............. H10B 41/20 257/E21.409 |
| 2010/0207195 A1* | 8/2010 | Fukuzumi .............. H10B 41/27 257/326 |
| 2011/0312174 A1* | 12/2011 | Lee ........................ H10B 43/27 257/E21.294 |
| 2016/0204117 A1* | 7/2016 | Liu ..................... H10D 30/0411 257/324 |
| 2019/0035942 A1 | 1/2019 | Kwon et al. |
| 2020/0098776 A1* | 3/2020 | Sugisaki ................ H10B 43/35 |
| 2021/0036016 A1 | 2/2021 | Park et al. |

FOREIGN PATENT DOCUMENTS

| | | |
|---|---|---|
| CN | 111244098 B | 3/2021 |
| KR | 102313920 B1 | 10/2021 |

* cited by examiner

THREE-DIMENSIONAL SEMICONDUCTOR MEMORY DEVICE AND ELECTRONIC SYSTEM INCLUDING VERTICAL STRUCTURES AND SEED LAYER

CROSS-REFERENCE TO RELATED APPLICATIONS

This U.S. non-provisional patent application claims priority under 35 U.S.C. § 119 to Korean Patent Application No. 10-2021-0095996, filed on Jul. 21, 2021, in the Korean Intellectual Property Office, the entire contents of which are hereby incorporated by reference.

BACKGROUND

The present inventive concepts relate to a three-dimensional semiconductor memory device and an electronic system including the same, and in particular, to a nonvolatile three-dimensional semiconductor memory device including a vertical channel structure, a method of fabricating the same, and an electronic system including the same.

A semiconductor device capable of storing a large amount of data is required as a part of an electronic system. Higher integration of semiconductor devices is required to satisfy consumer demands for large data storing capacity, superior performance, and inexpensive prices. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

SUMMARY

Some example embodiments of the inventive concepts provide three-dimensional semiconductor memory devices with improved reliability and electrical characteristics and methods of simplifying a process of fabricating the three-dimensional semiconductor memory devices. Such three-dimensional semiconductor memory devices may overcome limitations on increased integration for two-dimensional or planar semiconductor devices.

Some example embodiments of the inventive concepts provide electronic systems including one or more of the three-dimensional semiconductor memory devices.

According to some example embodiments of the inventive concepts, a three-dimensional semiconductor memory device may include a substrate, a stack structure including interlayer dielectric layers and gate electrodes, which are alternately and repeatedly stacked on the substrate, the stack structure including a first stack structure on the substrate and a second stack structure on the first stack structure, a seed layer interposed between the first stack structure and the second stack structure and extended in a horizontal direction, vertical channel structures that penetrate the stack structure and are in contact with the substrate, and a first contact plug that penetrates the stack structure and is in contact with one of the gate electrodes. The seed layer may include a first seed pattern enclosing the vertical channel structures and a second seed pattern enclosing the first contact plug, and the first seed pattern and the second seed pattern may be spaced apart from each other in the horizontal direction.

According to some example embodiments of the inventive concepts, a three-dimensional semiconductor memory device may include a first substrate including a first region, a second region extended from the first region in a first direction, and a third region adjacent to the second region in the first direction, a peripheral circuit structure including peripheral transistors, which are provided on the first substrate, and a first insulating layer, which covers the peripheral transistors, a second substrate on the peripheral circuit structure and extended from the first region to the second region, a second insulating layer on the peripheral circuit structure on the third region, a stack structure including interlayer dielectric layers and gate electrodes, which are alternately and repeatedly stacked on the second substrate, the stack structure including a first stack structure on the second substrate and a second stack structure on the first stack structure, a mold structure on a portion of the second region and enclosed by the stack structure, a seed layer, which covers the first stack structure and the mold structure and is extended in the first direction, vertical channel structures on the first region to penetrate the stack structure and to be in contact with the second substrate, a first contact plug on the second region to penetrate the stack structure and connected to one of the gate electrodes, a second contact plug on the portion of the second region to penetrate the mold structure and electrically connected to one of the peripheral transistors of the peripheral circuit structure, a third contact plug on the second region to be in contact with the second substrate, and a fourth contact plug provided on the third region to penetrate the second insulating layer and electrically connected to another one of the peripheral transistors of the peripheral circuit structure. The vertical channel structures and the first to fourth contact plugs may have top surfaces located at a same level, and an upper width of each of the first to fourth contact plugs may be larger than an upper width of each of the vertical channel structures. The seed layer may include a first seed pattern enclosing the vertical channel structures and a second seed pattern enclosing each of the first to fourth contact plugs.

According to some example embodiments of the inventive concepts, an electronic system may include a three-dimensional semiconductor memory device and a controller, which is electrically connected to the three-dimensional semiconductor memory device and is configured to control the three-dimensional semiconductor memory device. The three-dimensional semiconductor memory device may include a substrate, a stack structure including interlayer dielectric layers and gate electrodes, which are alternately and repeatedly stacked on the substrate, the stack structure including a first stack structure on the substrate and a second stack structure on the first stack structure, a seed layer interposed between the first stack structure and the second stack structure and extended in a horizontal direction, vertical channel structures that penetrate the stack structure and are in contact with the substrate, contact plugs that penetrate the stack structure and are in contact with one of the gate electrodes, and an input/output pad connected to one of the contact plugs. The controller may be electrically connected to the three-dimensional semiconductor memory device through the input/output pad. The seed layer may include a first seed pattern, which is in contact with a side surface of each of the vertical channel structures, and a second seed pattern, which is in contact with a side surface of each of the first contact plugs and is spaced apart from the first seed pattern.

DETAILED DESCRIPTION

Figure 1:
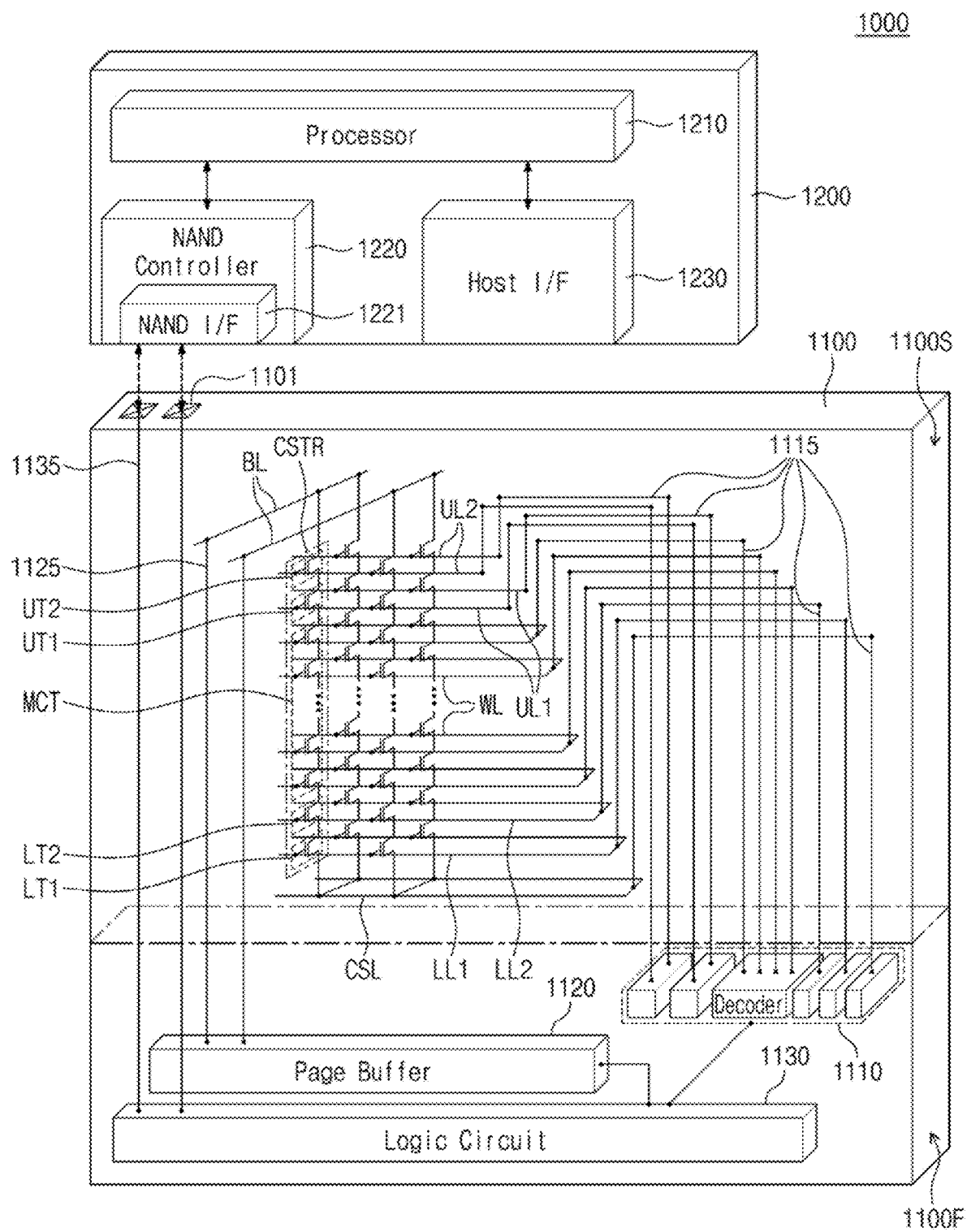
FIG. 1 is a schematic diagram illustrating an electronic system including a three-dimensional semiconductor memory device according to some example embodiments of the inventive concepts.

Example embodiments of the inventive concepts will now be described more fully with reference to the accompanying drawings, in which example embodiments are shown.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements and/or "identical" to other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic diagram illustrating an electronic system including a three-dimensional semiconductor memory device according to some example embodiments of the inventive concepts.

Referring to FIG. 1, an electronic system 1000 may include a three-dimensional semiconductor memory device 1100 and a controller 1200, which is electrically connected to the three-dimensional semiconductor memory device 1100 and which may be configured to control the three-dimensional semiconductor memory device 1100. A three-dimensional semiconductor memory device 1100 included in the electronic system 1000 of FIG. 1 may be a three-dimensional semiconductor memory device according to any of the example embodiments. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. In some example embodiments, the first region 1100F may be disposed beside the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments.

In some example embodiments, the first transistors LT1 and LT2 may include a ground selection transistor, and the second transistors UT1 and UT2 may include a string selection transistor. The first lines LL1 and LL2 may serve as gate electrodes of the first transistors LT1 and LT2, respectively. The word lines WL may serve as gate electrodes of the memory cell transistors MCT. The second lines UL1 and UL2 may serve as gate electrodes of the second transistors UT1 and UT2, respectively.

In some example embodiments, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S. The controller 1200 may be electrically connected to a three-dimensional semiconductor memory device 1100 through an input/output pad 1101 of the three-dimensional semiconductor memory device 1100.

The controller 1200 may include a processor 1210, a NAND controller 1220, and a host interface 1230. For example, the electronic system 1000 may include a plurality of three-dimensional semiconductor memory devices 1100, and in this case, the controller 1200 may be configured to control the plurality of three-dimensional semiconductor memory devices 1100. The controller 1200 may include a memory, which may be a non-transitory computer readable storage medium (e.g., a solid state drive) storing a program of instructions, and the processor 1210 may be configured to execute the program of instructions to cause the controller 1200 to control one or more of the three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing to the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, data, which will be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the semiconductor device 1100 in response to the control command.

Figure 2:
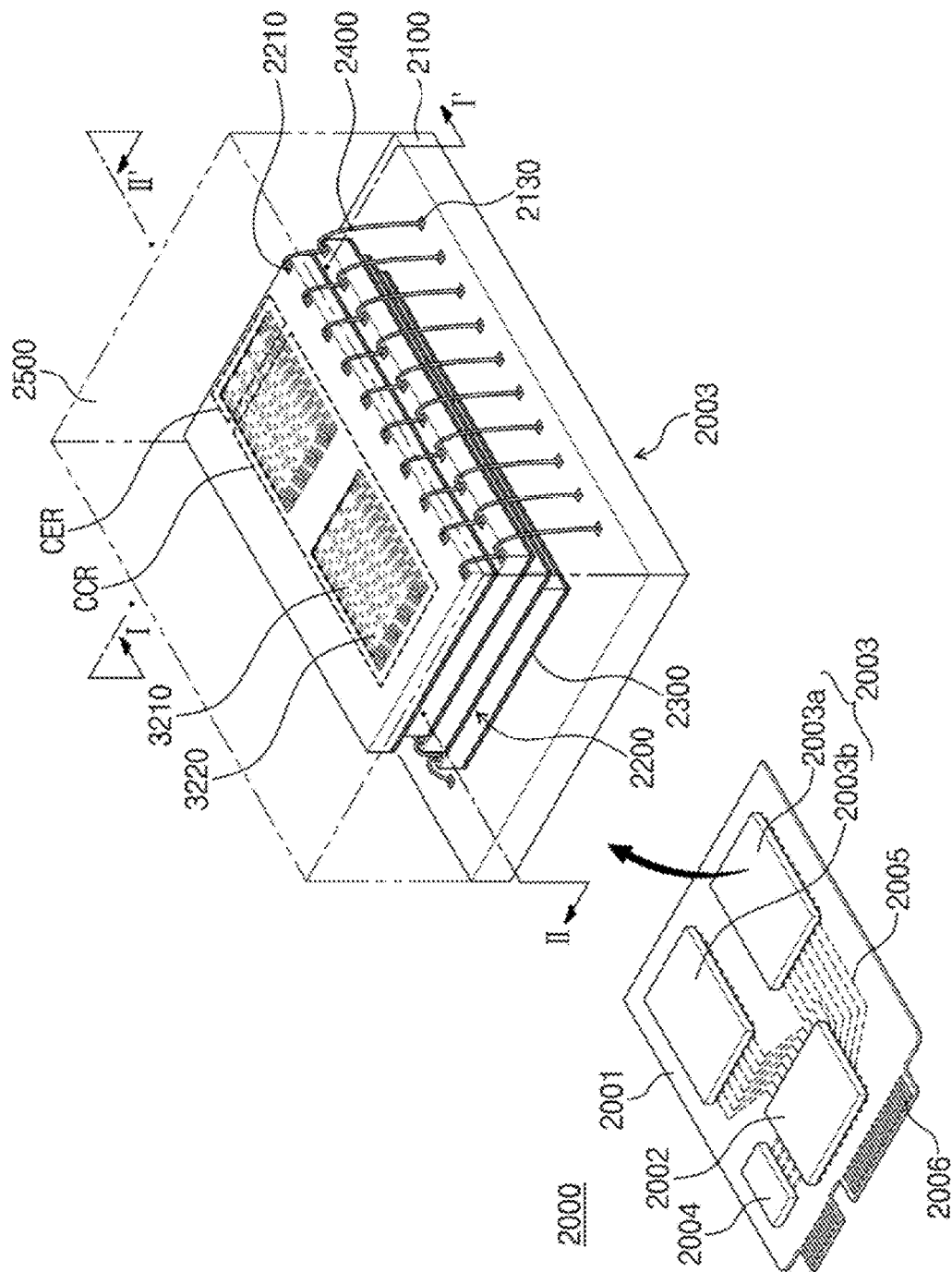
FIG. 2 is a perspective view schematically illustrating an electronic system including a three-dimensional semiconductor memory device according to some example embodiments of the inventive concepts.

FIG. 2 is a perspective view schematically illustrating an electronic system including a three-dimensional semiconductor memory device according to some example embodiments of the inventive concepts. A three-dimensional semiconductor memory device included in the electronic system 2000 of FIG. 2 may be a three-dimensional semiconductor memory device according to any of the example embodiments.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and the external host. In some example embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In some example embodiments, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device, which will be described below.

In some example embodiments, the connection structure 2400 may be a bonding wire electrically connecting the input/output pads 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In some example embodiments, the semiconductor chips 2200 in each of the first and second semiconductor packages 2003a and 2003b may be electrically connected to each other by through silicon vias (TSVs), not by the connection structure 2400 provided in the form of bonding wires.

In some example embodiments, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
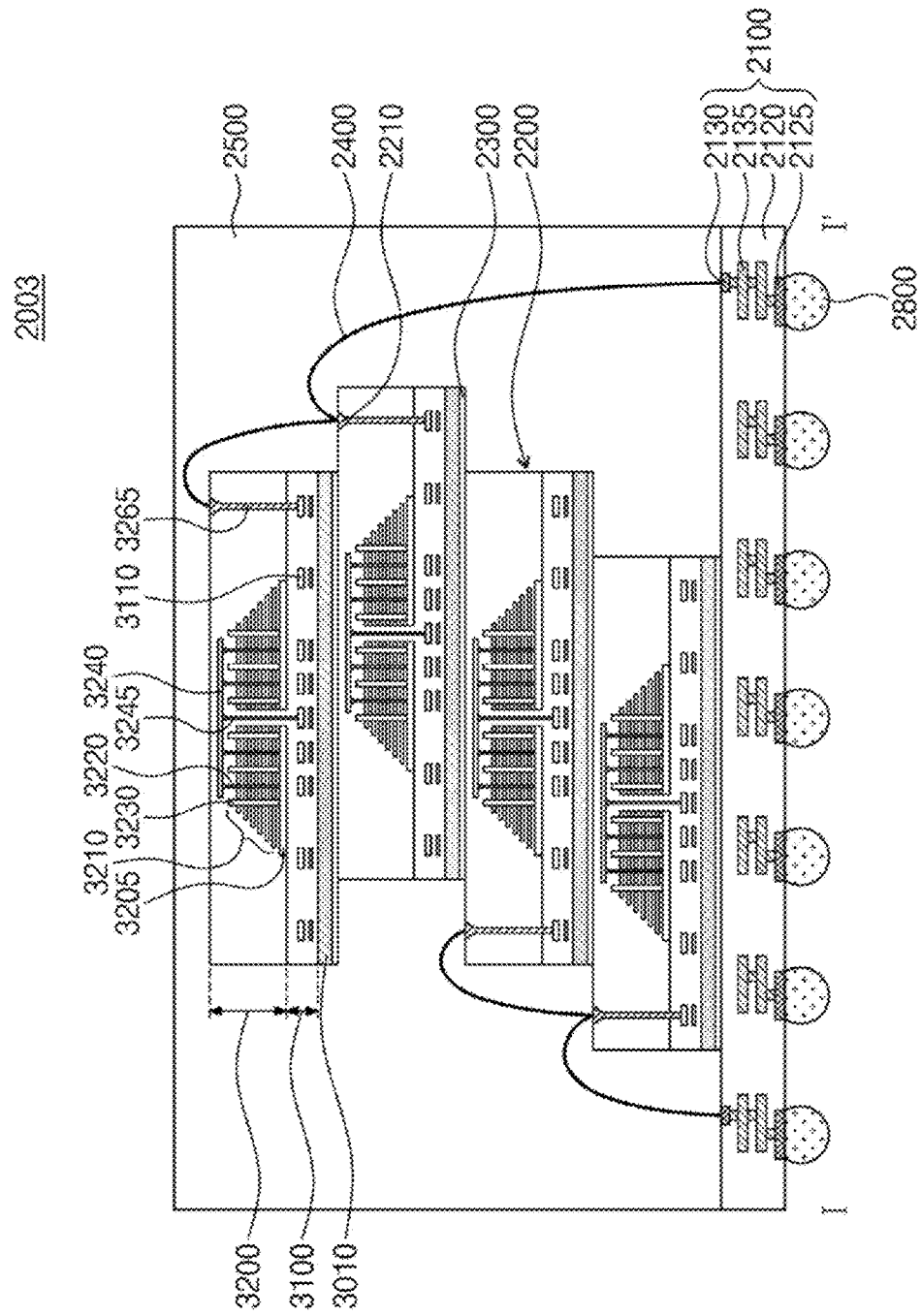
FIGS. 3 and 4 are sectional views, which are respectively taken along lines I-I' and II-II' of FIG. 2 to illustrate a semiconductor package including a three-dimensional semiconductor memory device according to some example embodiments of the inventive concepts.
Figure 4:
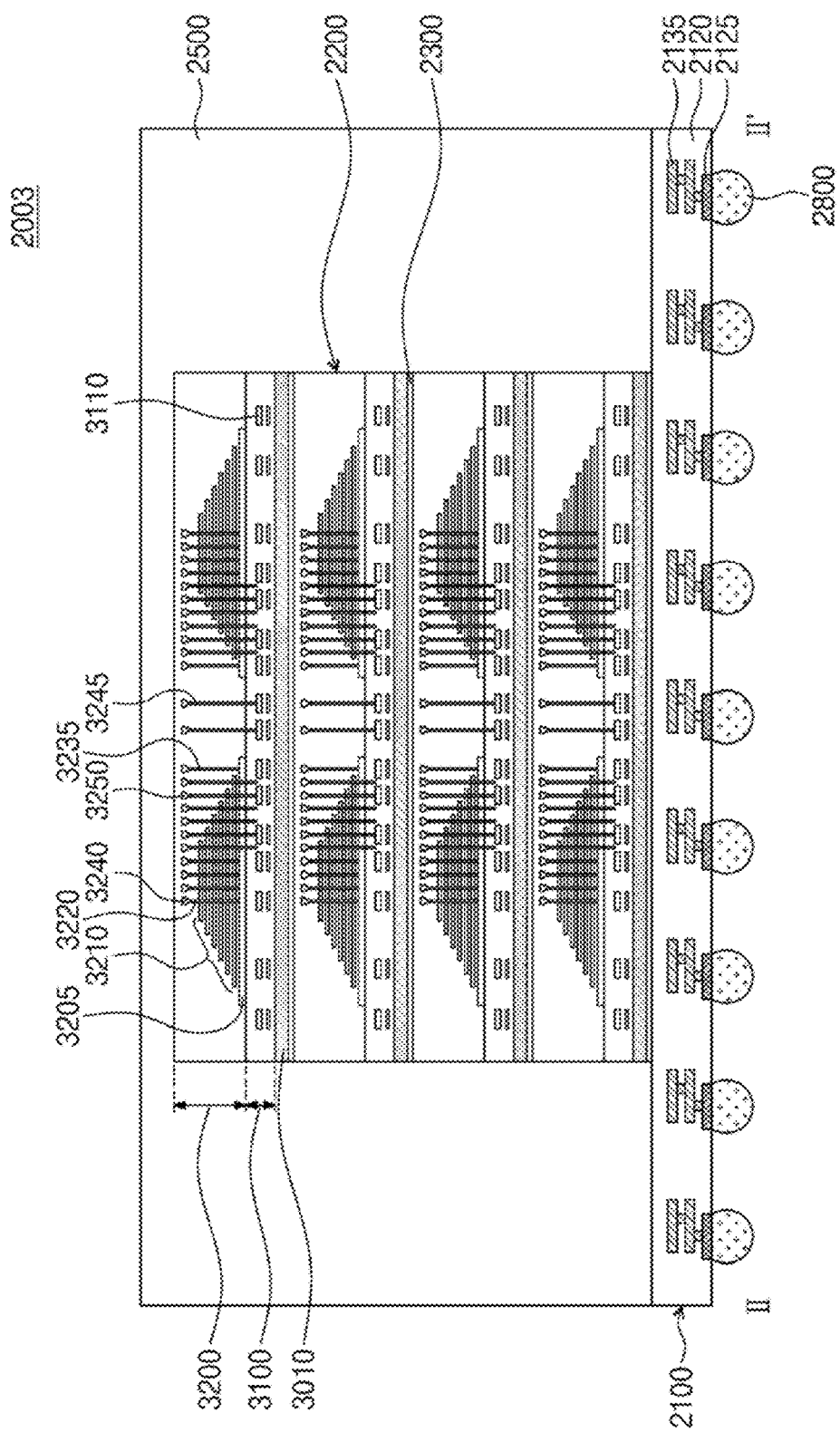

FIGS. 3 and 4 are sectional views, which are respectively taken along lines I-I' and II-II' of FIG. 2 to illustrate a semiconductor package including a three-dimensional semiconductor memory device according to some example embodiments of the inventive concepts. A three-dimensional semiconductor memory device included in the semiconductor package 2003 of FIGS. 3-4 may be a three-dimensional semiconductor memory device according to any of the example embodiments.

Referring to FIGS. 3 and 4, the semiconductor package 2003 may include the package substrate 2100, a plurality of semiconductor chips on the package substrate 2100, and the molding layer 2500 covering the package substrate 2100 and the semiconductor chips.

The package substrate 2100 may include a package substrate body portion 2120, the package upper pads 2130 disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a common source line 3205, the gate stack structure 3210 on the common source line 3205, the vertical channel structures 3220 and separation structures 3230 penetrating the gate stack structure 3210, bit lines 3240 electrically connected to the vertical channel structures 3220, gate interconnection lines 3235 electrically connected to word lines (e.g., WL of FIG. 1) of the gate stack structure 3210, and conductive lines 3250. At least one of the gate interconnection lines 3235 may be electrically connected to one of the word lines WL and may be provided to penetrate others of the word lines WL and to be electrically connected to the peripheral lines 3110 of the first structure 3100. At least one of the gate interconnection lines 3235 may be electrically connected to the common source line 3205. In some example embodiments, a penetration line 3245 may be formed when the gate interconnection lines 3235 are formed.

Each of the semiconductor chips 2200 may include the penetration lines 3245, which are electrically connected to the peripheral lines 3110 of the first structure 3100 and are extended into the second structure 3200. The penetration line 3245 may penetrate the gate stack structure 3210 and, in some example embodiments, at least one penetration line 3245 may be further provided outside the gate stack structure 3210. Each of the semiconductor chips 2200 may further include an input/output interconnection line 3265, which is extended into the second structure 3200 and is electrically connected to the peripheral line 3110 of the first structure 3100, and the input/output pad 2210, which is electrically connected to the input/output interconnection line 3265.

Figure 5:
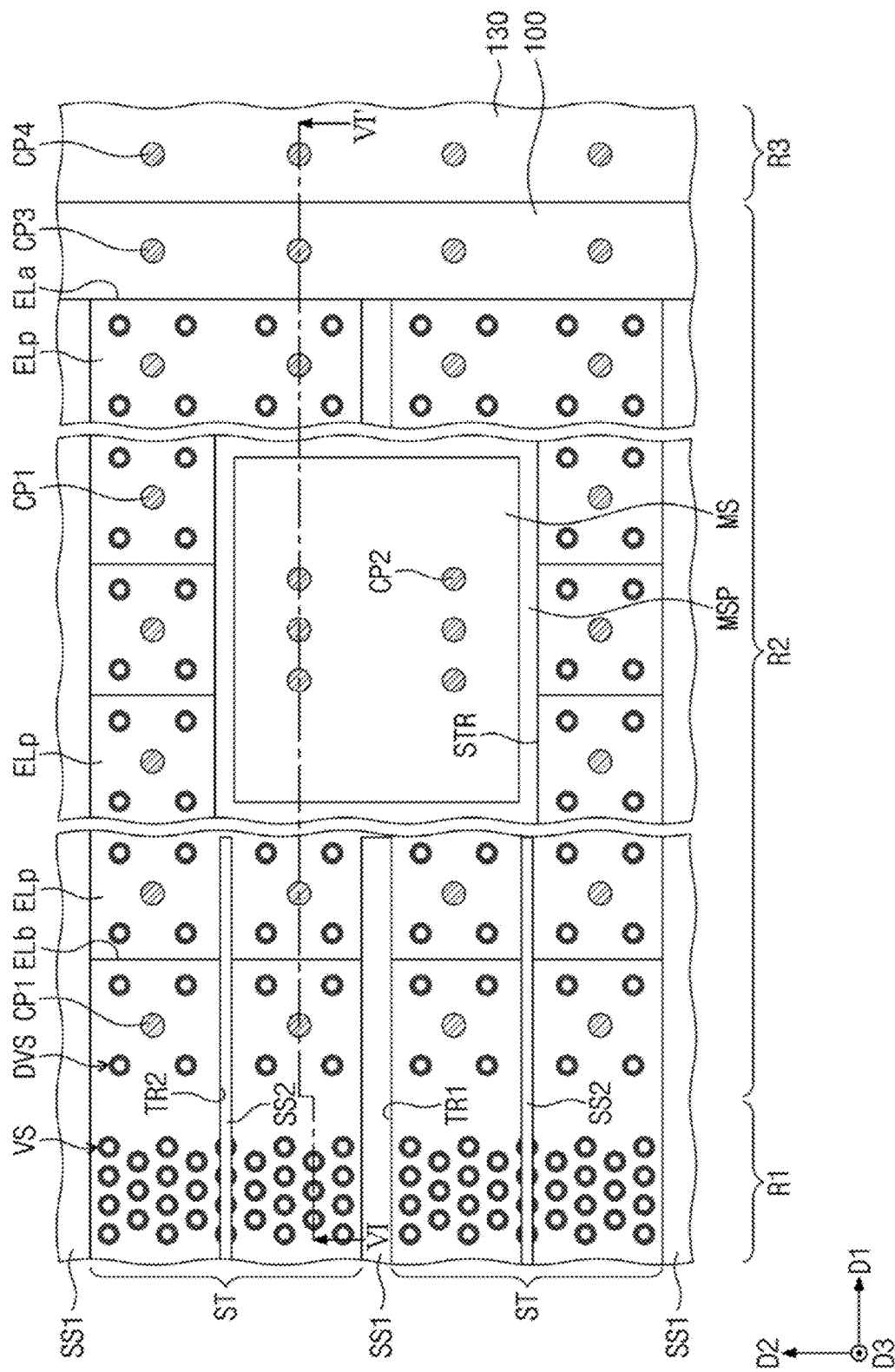
FIG. 5 is a plan view illustrating a three-dimensional semiconductor memory device according to some example embodiments of the inventive concepts.
Figure 6:
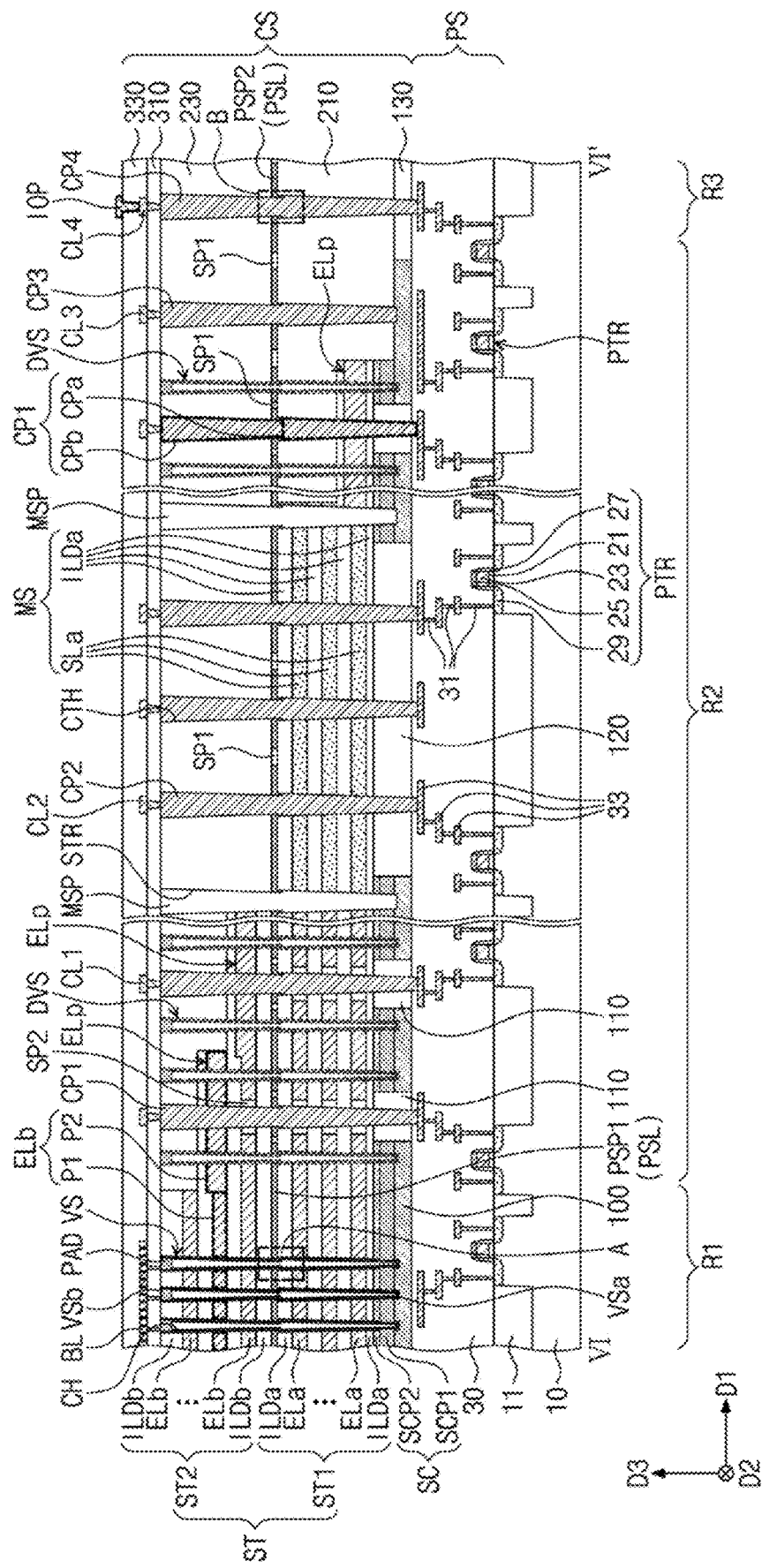
FIG. 6 is a sectional view, which is taken along a line VI-VI' of FIG. 5 to illustrate a three-dimensional semiconductor memory device according to some example embodiments of the inventive concepts.

FIG. 5 is a plan view illustrating a three-dimensional semiconductor memory device according to some example embodiments of the inventive concepts. FIG. 6 is a sectional view, which is taken along a line VI-VI' of FIG. 5 to illustrate a three-dimensional semiconductor memory device according to some example embodiments of the inventive concepts. It will be understood that the three-dimensional semiconductor memory device according to FIGS. 5-6 may be any of the three-dimensional semiconductor memory devices according to any of the example embodiments, including for example the three-dimensional semiconductor memory device 1100 shown in FIG. 1.

Referring to FIGS. 5 and 6, a first substrate 10 including a first region R1, a second region R2, and a third region R3 may be provided. The first substrate 10 may be extended in a first direction D1, which is oriented from the first region R1 toward the third region R3, and a second direction D2, which is not parallel to the first direction D1. A top surface of the first substrate 10 may be perpendicular to a third direction D3 crossing the first and second directions D1 and D2. For example, the first direction D1, the second direction D2, and the third direction D3 may be orthogonal to each other.

When viewed in a plan view, the second region R2 may be extended from the first region R1 in the first direction D1. The third region R3 may be adjacent to the second region R2 in the first direction D1. The second region R2 may be between the first region R1 and the third region R3 in the first direction D1. The first region R1 may be a region, in which the vertical channel structures 3220, the separation structures 3230, and the bit lines 3240 described with reference to FIGS. 3 and 4 are provided. The second region R2 may be a region, in which a staircase structure including pad portions ELp to be described below is provided. The third region R3 may be a region, in which the penetration line 3245 or the input/output interconnection line 3265 described with reference to FIGS. 3 and 4 is provided.

In some example embodiments, the first substrate 10 may be a silicon substrate, a silicon-germanium substrate, a germanium substrate, or a structure including a single-crystalline silicon substrate and a single crystalline epitaxial layer grown therefrom. A device isolation layer 11 may be provided in the first substrate 10. The device isolation layer 11 may define an active region of the first substrate 10. The device isolation layer 11 may be formed of or include, for example, silicon oxide.

A peripheral circuit structure PS may be provided on the first substrate 10. The peripheral circuit structure PS may include peripheral transistors PTR and peripheral contact plugs 31, which are provided on the active region of the first substrate 10, peripheral circuit lines 33, which are electrically connected to the peripheral transistors PTR through the peripheral contact plugs 31, and a first insulating layer 30, which is provided to cover or enclose them (e.g., cover the peripheral transistors PTR). The peripheral circuit structure PS may correspond to the first region 1100F of FIG. 1, and the peripheral circuit interconnection lines 33 may correspond to the peripheral lines 3110 of FIGS. 3 and 4.

The peripheral transistors PTR, the peripheral contact plugs 31, and the peripheral circuit lines 33 may constitute a peripheral circuit. For example, the peripheral transistors PTR may constitute the decoder circuit 1110, the page buffer 1120, and the logic circuit 1130 of FIG. 1. More specifically, each of the peripheral transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23.

The peripheral circuit lines 33 may be electrically connected to the peripheral transistors PTR through the peripheral contact plugs 31. Each of the peripheral transistors PTR may be an NMOS transistor or a PMOS transistor and, in some example embodiments, it may be a gate-all-around type transistor. As an example, widths of the peripheral contact plugs 31 may increase with increasing distance from the first substrate 10. The peripheral contact plugs 31 and the peripheral circuit interconnection lines 33 may be formed of or include at least one of conductive materials (e.g., metallic materials).

The first insulating layer 30 may be provided on the top surface of the first substrate 10. The first insulating layer 30 may be provided on the first substrate 10 to cover the peripheral transistors PTR, the peripheral contact plugs 31, and the peripheral circuit lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials.

A cell array structure CS, which includes a second substrate 100, a stack structure ST, a mold structure MS, vertical channel structures VS penetrating them, and first to fourth contact plugs CP1, CP2, CP3, and CP4, may be provided on the peripheral circuit structure PS. Hereinafter, the cell array structure CS will be described in more detail below.

The second substrate 100 may be provided on the first and second regions R1 and R2 and on the first insulating layer 30. The second substrate 100 may be on the peripheral circuit structure PS and may be extended from the first region R1 to at least the second region R2. The second substrate 100 may be extended in the first and second directions D1 and D2. The second substrate 100 may not be provided on the third region R3. The second substrate 100 may be a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs).

First insulating patterns 110 and a second insulating pattern 120 may be provided in the second substrate 100, and here, the first and second insulating patterns 110 and 120 may define regions for first contact plugs CP1 and the mold structure MS to be described below. The first and second insulating patterns 110 and 120 may be surrounded by the second substrate 100, when viewed in a plan view.

A second insulating layer 130 may be provided on the third region R3 and on the first insulating layer 30 and may be understood to be on the peripheral circuit structure PS in the third region R3. The second insulating layer 130 may be in contact with a side surface of the second substrate 100. A top surface of the second insulating layer 130 may be coplanar or substantially coplanar with a top surface of the second substrate 100. The second insulating layer 130 may be formed of or include at least one of, for example, silicon oxide, silicon nitride, silicon oxynitride, and/or low-k dielectric materials.

The stack structure ST may be provided on the second substrate 100. The stack structure ST may be extended from the first region R1 to the second region R2. The stack structure ST may correspond to the gate stack structures 3210 of FIGS. 3 and 4.

In some example embodiments, the three-dimensional semiconductor memory device may include a plurality of stack structures ST arranged in the second direction D2. When viewed in a plan view, a first separation structure SS1 may be provided in a first trench TR1, which is disposed between the stack structures ST and is extended in the first direction D1. The stack structures ST may be spaced apart from each other in the second direction D2, with the first separation structure SS1 interposed therebetween. In addition, when viewed in a plan view, a second separation structure SS2 may be provided in a second trench TR2, which is extended in the first direction D1 to cross a center of each of the stack structures ST. For brevity's sake, just one stack structure ST will be described below, but the others of the stack structures ST may also have the same or substantially the same features as described below.

The stack structure ST may include interlayer dielectric layers ILDa and ILDb and gate electrodes ELa and ELb, which are alternately and repeatedly stacked. The gate electrodes ELa and ELb may correspond to the word lines WL, the first lines LL1 and LL2, and the second lines UL1 and UL2 of FIG. 1.

More specifically, the stack structure ST may include a first stack structure ST1 on the second substrate 100 and a second stack structure ST2 on the first stack structure ST1. The first stack structure ST1 may include first interlayer dielectric layers ILDa and first gate electrodes Ela, which are alternately and repeatedly stacked, and the second stack structure ST2 may include second interlayer dielectric layers ILDb and second gate electrodes ELb, which are alternately and repeatedly stacked.

A length of each of the first and second gate electrodes ELa and ELb in the first direction D1 may decrease with increasing distance from the second substrate 100 (i.e., with increasing distance in the third direction D3). That is, the length of each of the first and second gate electrodes ELa and ELb in the first direction D1 may be larger than a length of another electrode thereon in the first direction D1. The lowermost one of the first gate electrodes ELa of the first stack structure ST1 may have the largest length in the first direction D1, and the uppermost one of the second gate electrodes ELb of the second stack structure ST2 may have the smallest length in the first direction D1.

The first and second gate electrodes ELa and ELb may have the pad portions ELp on the second region R2. The pad portions ELp of the first and second gate electrodes ELa and ELb may be disposed at positions that are different from each other in horizontal and vertical directions. The pad portions ELp may form the staircase structure in the first direction D1. As described herein, a vertical direction may be understood to be perpendicular to an in-plane direction of the substrate 100 and/or perpendicular to one or more surfaces of the substrate 100 (e.g., an upper surface of the substrate). For example, the third direction D3 may be a vertical direction. As described herein, a horizontal direction may be understood to be parallel to an in-plane direction of the substrate 100 and/or parallel to one or more surfaces of the substrate 100 (e.g., an upper surface of the substrate). For example, the first and second directions D1 and D2 may be horizontal directions.

Each of the first and second gate electrodes ELa and ELb may include a first portion P1, which is provided on the first region R1 and is in contact with the vertical channel structures VS to be described below, and a second portion P2, which is provided on the second region R2 and is referred to as the pad portion ELp. A thickness of the second portion P2 may be larger than a thickness of the first portion P1. In the present specification, the thickness may mean a thickness measured in the third direction D3.

Due to the staircase structure, each of the first and second stack structures ST1 and ST2 may have a decreasing thickness with increasing distance from the outermost one of the vertical channel structures VS, and the side surfaces of the first and second gate electrodes ELa and ELb may be spaced apart from each other by a substantially constant distance in the first direction D1, when viewed in a plan view.

The first and second gate electrodes ELa and ELb may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

The first and second interlayer dielectric layers ILDa and ILDb may be provided between the first and second gate electrodes ELa and ELb. In other words, the first and second interlayer dielectric layers ILDa and ILDb may be provided such that a length in the first direction D1 decreases with increasing distance from the second substrate 100, similar to the first and second gate electrodes ELa and ELb.

The lowermost one of the second interlayer dielectric layers ILDb and the uppermost one of the first interlayer dielectric layers ILDa may be adjacent to each other but may be spaced apart from each other by a seed layer PSL interposed therebetween. In some example embodiments, a thickness of each of the first and second interlayer dielectric layers ILDa and ILDb may be smaller than a thickness of each of the first and second gate electrodes ELa and ELb. The lowermost one of the first interlayer dielectric layers ILDa may be thinner than the others of the interlayer dielectric layers ILDa and ILDb. In addition, each of the uppermost and lowermost ones of the second interlayer dielectric layers ILDb may be thicker than the others of the interlayer dielectric layers ILDa and ILDb. However, inventive concepts is not limited to this example, and the thicknesses of the first and second interlayer dielectric layers ILDa and ILDb may be variously changed depending on requirements for the semiconductor device.

The first and second interlayer dielectric layers ILDa and ILDb may be formed of or include at least one of, for example, silicon oxide, silicon nitride, silicon oxynitride, and/or low-k dielectric materials. For example, the first and second interlayer dielectric layers ILDa and ILDb may be formed of or include high density plasma (HDP) oxide or tetraethyl orthosilicate (TEOS).

A source structure SC may be provided between the second substrate 100 and the lowermost one of the first interlayer dielectric layers ILDa. The second substrate 100 and the source structure SC may correspond to the common source line CSL of FIG. 1 and the common source line 3205 of FIGS. 3 and 4.

The source structure SC may be extended parallel to the first and second gate electrodes ELa and ELb of the stack structure ST or in the first and second directions D1 and D2. The source structure SC may include a first source conductive pattern SCP1 and a second source conductive pattern SCP2 which are sequentially stacked. The second source conductive pattern SCP2 may be provided between the first source conductive pattern SCP1 and the lowermost one of the first interlayer dielectric layers ILDa. A thickness of the first source conductive pattern SCP1 may be larger than a thickness of the second source conductive pattern SCP2. Each of the first and second source conductive patterns SCP1 and SCP2 may include a doped semiconductor material. In some example embodiments, an impurity concentration of the first source conductive pattern SCP1 may be higher than an impurity concentration of the second source conductive pattern SCP2.

Each of the first and second insulating patterns 110 and 120 may be extended from the side surface of the second substrate 100 to the side surface of the source structure SC. In some example embodiments, each of the first and second insulating patterns 110 and 120 may have a top surface, which is coplanar or substantially coplanar with the top surface of the source structure SC, and may have a bottom surface, which is coplanar or substantially coplanar with the bottom surface of the second substrate 100.

The vertical channel structures VS may be provided on the first region R1 to penetrate the stack structure ST and the source structure SC and to be in contact with the second substrate 100. The vertical channel structures VS may be provided to penetrate at least a portion of the second substrate 100 and may have a bottom surface located at a level lower than the top surface of the second substrate 100 and the bottom surface of the source structure SC.

In the present specification, the term 'level' may mean a vertical height measured from the bottom or top surface of the first substrate 10 in a direction perpendicular to the bottom or top surface of the first substrate 10 (e.g., in the third direction D3). In the present specification, the term 'width' may mean a width (or length) measured in a direction parallel to the bottom or top surface of the first substrate 10 (e.g., in the first direction D1 and/or second direction D2).

The vertical channel structures VS may be arranged to form a zigzag shape in the first or second direction D1 or D2, when viewed in a plan view. The vertical channel structures VS may not be provided on the second region R2. The vertical channel structures VS may correspond to the vertical channel structures 3220 of FIGS. 2 to 4. The vertical channel structures VS may correspond to the channel regions of the first transistors LT1 and LT2, the memory cell transistors MCT, and the second transistors UT1 and UT2 of FIG. 1.

The vertical channel structures VS may be provided in vertical channel holes CH, respectively, which are formed to penetrate the stack structure ST. Each of the vertical channel structures VS may include a first vertical channel structure VSa penetrating the first stack structure ST1 and a second vertical channel structure VSb penetrating the second stack structure ST2. The first vertical channel structure VSa may be connected to (e.g., in direct contact with) the second vertical channel structure VSb in the third direction D3 (e.g., in a vertical direction).

In some example embodiments, each of the first and second vertical channel structures VSa and VSb may have an increasing width in the third direction D3. In some example embodiments, the uppermost width of the first vertical channel structure VSa may be larger than the lowermost width of the second vertical channel structure VSb. In other words, a side surface of each of the vertical channel structures VS may have a stepwise shape near a boundary between the first and second vertical channel structures VSa and VSb. However, the inventive concepts is not limited to this example, and the side surface of each of the vertical channel structures VS may have three or more stepwise portions located at different levels or may be a flat shape without a stepwise portion, unlike that illustrated in the drawings.

A plurality of dummy vertical channel structures DVS may be provided on the second region R2 to penetrate a third insulating layer 210 and/or a fourth insulating layer 230, which will be described below, the stack structure ST, and the source structure SC. More specifically, the dummy vertical channel structures DVS may be provided to penetrate the pad portions ELp of the first and second gate electrodes ELa and ELb. The dummy vertical channel structures DVS may be provided near or around the first contact plugs CP1, which will be described below. The dummy vertical channel structures DVS may not be provided on the first region R1. The dummy vertical channel structures DVS and the vertical channel structures VS may be formed at the same time and may have the same or substantially the same structure. However, in some example embodiments, the dummy vertical channel structures DVS may not be provided.

The third insulating layer 210 may be provided on the second and third regions R2 and R3 to cover the first stack structure ST1, a portion of the second substrate 100, the second insulating layer 130, and the fourth insulating layer 230 may be provided on the second and third regions R2 and R3 to cover the second stack structure ST2 and the seed layer PSL. More specifically, the third and fourth insulating layers 210 and 230 may be provided to cover the staircase structure of the stack structure ST or to cover the pad portions ELp of the first and second gate electrodes ELa and ELb. Each of the third and fourth insulating layers 210 and 230 may have a substantially flat top surface. The top surface of the third insulating layer 210 may be in contact with a bottom surface of the seed layer PSL, and the bottom surface of the fourth insulating layer 230 may be in contact with a top surface of the seed layer PSL.

Each of the third and fourth insulating layers 210 and 230 may include an insulating layer or a plurality of stacked insulating layers. Each of the third and fourth insulating layers 210 and 230 may be formed of or include at least one of insulating materials (e.g., silicon oxide, silicon nitride, silicon oxynitride, and/or low-k dielectric materials).

The seed layer PSL may be interposed between the first stack structure ST1 and the second stack structure ST2 and between the third insulating layer 210 and the fourth insulating layer 230. The seed layer PSL may extend in a horizontal direction (e.g., the first direction D1 and/or the second direction D2). The seed layer PSL may cover the first stack structure ST1 and the mold structure MS and extend in the first direction D1. The seed layer PSL may include a first seed pattern PSP1, which is provided on the first region R1 and encloses the vertical channel structures VS, and second seed patterns PSP2, which are provided on the second and third regions R2 and R3 and enclose the first to fourth contact plugs CP1, CP2, CP3, and CP4, respectively. In some example embodiments, the second seed patterns PSP2 may be replaced by a single second seed pattern that encloses (and is in contact with respective side surfaces of) each of the first to fourth contact plugs CP1 to CP4. First separation insulating patterns SP1 may be provided between the first seed pattern PSP1 and one of the second seed patterns PSP2 and between the second seed patterns PSP2. Accordingly, the first seed pattern PSP1 may be spaced apart from (e.g., isolated from direct contact with) the second seed patterns PSP2 (e.g., in a horizontal direction such as the first direction D1 and/or the second direction D2). The first separation insulating patterns SP1 may be referred to herein as separation patterns which are between adjacent seed patterns of the first seed patterns PSP1 and second seed patterns PSP2 (including second seed patterns referred to herein as third seed patterns). The first separation insulating patterns SP1 may reduce or prevent the first to fourth contact plugs CP1, CP2, CP3, and CP4 from being electrically connected to each other or may electrically separate the first to fourth contact plugs CP1, CP2, CP3, and CP4 from each other.

The first seed pattern PSP1 of the seed layer PSL may be provided on the first region R1 and between the uppermost one of the first interlayer dielectric layers ILDa of the first stack structure ST1 and the lowermost one of the second interlayer dielectric layers ILDb of the second stack structure ST2. The second seed patterns PSP2 of the seed layer PSL may be provided on the second and third regions R2 and R3 and may be provided between the mold structure MS and the fourth insulating layer 230 or between the third insulating layer 210 and the fourth insulating layer 230.

The seed layer PSL may be formed of or include poly silicon. The first separation insulating patterns SP1 may be formed of or include the same insulating material as the third and fourth insulating layers 210 and 230.

In some example embodiments, the mold structure MS, which is enclosed by the stack structure ST, may be provided on a portion of the second region R2. The mold structure MS may include the first interlayer dielectric layers ILDa and first sacrificial layers SLa, which are alternately and repeatedly stacked. The first interlayer dielectric layers ILDa of the mold structure MS may be formed of or include the same material as the first interlayer dielectric layers ILDa of the first stack structure ST1. The first sacrificial layers SLa of the mold structure MS may be formed of or include an insulating material different from the first interlayer dielectric layers ILDa. For example, the first sacrificial layers SLa of the mold structure MS may be formed of or include silicon nitride or silicon oxynitride.

The mold structure MS may be spaced apart from the stack structure ST by a mold separation pattern MSP, which is provided in a mold separation trench STR and is interposed between the mold structure MS and the stack structure ST. The mold separation pattern MSP may be provided to enclose the mold structure MS. The second seed patterns PSP2 of the seed layer PSL and the first separation insulating patterns SP1 may be provided on the mold structure MS. The mold separation pattern MSP may be formed of or include an insulating material. Unlike that illustrated in the drawings, the first interlayer dielectric layers ILDa and the first sacrificial layers SLa of the mold structure MS may also be alternately and repeatedly stacked on the second seed patterns PSP2 of the seed layer PSL and the first separation insulating patterns SP1.

The first contact plugs CP1 may be provided on the second region R2 to penetrate the stack structure ST. Each of the first contact plugs CP1 may further penetrate one of the second seed patterns PSP2 of the seed layer PSL and one of the first insulating patterns 110. Each of the first contact plugs CP1 may further penetrate at least a portion of the first insulating layer 30 and may be electrically connected to one (e.g., a separate one) of the peripheral transistors PTR of the peripheral circuit structure PS. For example, the first contact plugs CP1 may be electrically connected to separate, respective (e.g., different) peripheral transistors PTR. The first contact plugs CP1 may have bottom surfaces which are located at a level lower than the bottom surface of the second substrate 100. A height of each of the first contact plugs CP1 in the third direction D3 may be larger than a height of each of the vertical channel structures VS in the third direction D3.

The first contact plugs CP1 may be in contact with and electrically connected to one of the gate electrodes ELa and ELb. For example, each of the first contact plugs CP1 may be in contact with the uppermost one of the gate electrodes ELa and ELb of the staircase structure, which is exposed to the outside of the stack structure ST and is used as the pad portion ELp. Each of the first contact plugs CP1 may be horizontally spaced apart from the others of the gate electrodes ELa and ELb, which are located below the pad portion ELp connected thereto, by second separation insulating patterns SP2 interposed therebetween and may be electrically separated from the others of the gate electrodes ELa and ELb. In some example embodiments, the second separation insulating patterns SP2 may be formed of or include the same insulating material as the first and second interlayer dielectric layers ILDa and ILDb. The first contact plugs CP1 may correspond to the gate interconnection lines 3235 of FIG. 4.

The second contact plug CP2 may be provided on the second region R2 to penetrate the fourth insulating layer 230, the mold structure MS, and the second insulating pattern 120. In some example embodiments, a plurality of second contact plugs CP2 may be provided, and in this case, the second contact plugs CP2 may be spaced apart from each other in the first direction D1 and may be electrically disconnected from each other by one of the first separation insulating patterns SP1 interposed therebetween. For brevity's sake, just one of the second contact plugs CP2 will be described below, but the others of the second contact plug CP2 may also have the same or substantially the same features as described below.

The second contact plug CP2 may be on a portion of the second region R2 and may further penetrate one of the second seed patterns PSP2 of the seed layer PSL. As shown, the second contact plug CP2 may penetrate the mold structure MS. The second contact plug CP2 may be spaced apart from the second substrate 100 in the first direction D1 and/or second direction D2. The second contact plug CP2 may further include at least a portion of the first insulating layer 30 and may be electrically connected to one of the peripheral transistors PTR of the peripheral circuit structure PS. The second contact plug CP2 may have a bottom surface, which is located at a level lower than the bottom surface of the second substrate 100. A height of each of the second contact plug CP2 in the third direction D3 may be larger than a height of each of the vertical channel structures VS in the third direction D3.

The third contact plug CP3 may be provided on the second region R2 to penetrate the third and fourth insulating layers 210 and 230 and to be in contact with the second substrate 100. The third contact plug CP3 may further penetrate one of the second seed patterns PSP2 of the seed layer PSL. The third contact plug CP3 may further penetrate at least a portion of the second substrate 100. The third contact plug CP3 may be spaced apart from the stack structure ST in the first direction D1. The third contact plug CP3 may have a bottom surface, which is located at a level between the top and bottom surfaces of the second substrate 100. A height of the third contact plug CP3 in the third direction D3 may be smaller than a height of each of the first and second contact plugs CP1 and CP2 in the third direction D3. The third contact plug CP3 may correspond to one of the gate interconnection lines 3235 of FIG. 4.

The fourth contact plug CP4 may be provided on the third region R3 to penetrate the second to fourth insulating layers 130, 210, and 230. The fourth contact plug CP4 may be spaced apart from the second substrate 100 in the first direction D1 and/or second direction D2. The fourth contact plug CP4 may further penetrate one of the second seed patterns PSP2 of the seed layer PSL. The fourth contact plug CP4 may further include at least a portion of the first insulating layer 30 and may be electrically connected to one of the peripheral transistors PTR of the peripheral circuit structure PS. A bottom surface of the fourth contact plug CP4 may be located at a level lower than a bottom surface of the second insulating layer 130 and the bottom surface of the second substrate 100. A height of the fourth contact plug CP4 in the third direction D3 may be larger than a height of each of the vertical channel structures VS in the third direction D3. The fourth contact plug CP4 may correspond to the penetration line 3245 or the input/output interconnection line 3265 of FIGS. 3 and 4. It will be understood that each of the first, second, and fourth contact plugs CP1, CP2, and CP4 may be connected to a separate one of the peripheral transistors PTR of the peripheral circuit structure PS.

The first to fourth contact plugs CP1, CP2, CP3, and CP4 may be provided in contact holes CTH, which are formed to penetrate at least a portion of the cell array structure CS. The first to fourth contact plugs CP1, CP2, CP3, and CP4 may have top surfaces, which are located at the same or substantially the same level as the top surfaces of the vertical channel structures VS. Restated, the vertical channel structures VS and the first to fourth contact plugs CP1, CP2, CP3, and CP4 may have top surfaces (e.g., respective top surfaces) that are located at a same level or substantially a same level. Each of the first to fourth contact plugs CP1, CP2, CP3, and CP4 may include a first conductive structure CPa adjacent to the first substrate 10 and a second conductive structure CPb on the first conductive structure CPa. The first conductive structure CPa may be connected to the second conductive structure CPb in the third direction D3 (e.g., vertical direction). Each of the second, third, and/or fourth contact plugs CP2, CP3, and/or CP4 may be in contact with one or more second seed patterns PSP2, sometimes referred to as one or more third seed patterns, which are spaced apart in the first direction D1 and/or the second direction D2 from the first seed pattern PSP1, and the second seed pattern PSP2 that encloses the first contact plug CP1. In some example embodiments, each of the second, third, and/or fourth contact plugs CP2, CP3, and/or CP4 may be in contact with separate such second seed patterns PSP2, also referred to as "third seed patterns" to distinguish from the second seed pattern PSP2 enclosing the first contact plug CP1.

In some example embodiments, each of the first and second conductive structures CPa and CPb may have an increasing width in the third direction D3. The uppermost width of the first conductive structure CPa may be larger than the lowermost width of the second conductive structure CPb. In other words, a side surface of each of the first to fourth contact plugs CP1, CP2, CP3, and CP4 may have a stepwise shape near a boundary between the first and second conductive structures CPa and CPb. However, the inventive concepts is not limited to this example, and the side surface of each of the first to fourth contact plugs CP1, CP2, CP3, and CP4 may have three or more stepwise portions located at different levels or may be a flat shape without a stepwise portion. In some example embodiments, an upper width (e.g., uppermost width) of each of the first to fourth contact plugs CP1 to CP4 may be larger than an upper width (e.g., uppermost width) of each of the vertical channel structures VS.

A fifth insulating layer 310 may be provided to cover the stack structure ST and the fourth insulating layer 230. The fifth insulating layer 310 may cover the top surfaces of the vertical channel structures VS, the dummy vertical channel structures DVS, the first to fourth contact plugs CP1, CP2, CP3, and CP4, and the mold separation pattern MSP.

Bit lines BL and first to fourth conductive lines CL1, CL2, CL3, and CL4 may be provided on the fifth insulating layer 310, and here, the bit lines BL and the first to fourth conductive lines CL1, CL2, CL3, and CL4 may be electrically connected to the vertical channel structures VS and the first to fourth contact plugs CP1, CP2, CP3, and CP4. The first to fourth contact plugs CP1, CP2, CP3, and CP4, the bit lines BL, the first to fourth conductive lines CL1, CL2, CL3, and CL4 may be formed of or include at least one of conductive materials (e.g., metallic materials). The bit lines BL may correspond to the bit line BL of FIG. 1 and the bit lines 3240 of FIGS. 3 and 4. The first to fourth conductive lines CL1, CL2, CL3, and CL4 may correspond to the conductive lines 3250 of FIG. 4.

A sixth insulating layer 330 may be provided on the fifth insulating layer 310 to cover the bit lines BL and the first to fourth conductive lines CL1, CL2, CL3, and CL4. Each of the fifth and sixth insulating layers 310 and 330 may include an insulating layer or a plurality of stacked insulating layers. The fifth and sixth insulating layers 310 and 330 may be formed of or include at least one of, for example, silicon oxide, silicon nitride, silicon oxynitride and/or low-k dielectric materials.

An input/output pad IOP (e.g., the input/output pad 1101 as shown in FIG. 1) may be provided on the sixth insulating layer 330 and may be electrically connected to the peripheral circuit structure PS through the fourth conductive line CL4 and the fourth contact plug CP4. The input/output pad IOP may correspond to the input/output pad 1101 of FIG. 1 and the input/output pads 2210 of FIGS. 2 to 4.

FIGS. 7A, 7B, 7C, and 7D are enlarged sectional views, each of which illustrates a portion (e.g., a portion 'A' of FIG. 6) of a three-dimensional semiconductor memory device according to some example embodiments of the inventive concepts. In the following description, an element previously described with reference to the above figures may be identified by the same reference number without repeating an overlapping description thereof, for concise description.

Figure 7A:
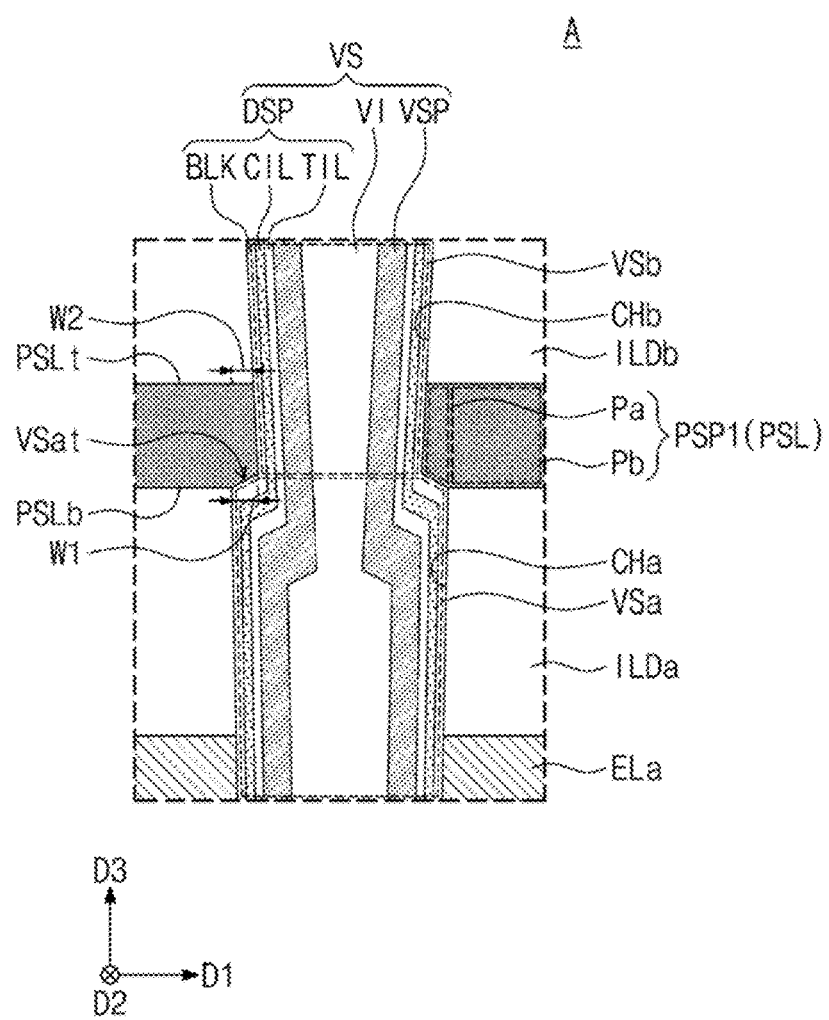
FIGS. 7A, 7B, 7C, and 7D are enlarged sectional views, each of which illustrates a portion (e.g., a portion 'A' of FIG. 6) of a three-dimensional semiconductor memory device according to some example embodiments of the inventive concepts.

Referring to FIGS. 6 and 7A, each of the vertical channel structures VS may include a data storage pattern DSP, which is adjacent to the stack structure ST or covers an inner side surface of each of the vertical channel holes CH, a vertical semiconductor pattern VSP, which is provided to conformally cover an inner side surface of the data storage pattern DSP, a gapfill insulating pattern VI, which is provided to fill an internal space delimited by the vertical semiconductor pattern VSP, and a conductive pad, which is provided in a space delimited by the gapfill insulating pattern VI and the data storage pattern DSP. In some example embodiments, a top surface of each of the vertical channel structures VS may have a circular, elliptical, or bar shape.

The vertical semiconductor pattern VSP may be provided between the data storage pattern DSP and the gapfill insulating pattern VI. The vertical semiconductor pattern VSP may be shaped like a bottom-closed pipe or macaroni. In some example embodiments, the vertical semiconductor pattern VSP may be in contact with a portion of the source structure SC. The vertical semiconductor pattern VSP may be formed of or include poly silicon.

The data storage pattern DSP may be shaped like a bottom-opened pipe or macaroni. The data storage pattern DSP may include a blocking insulating layer BLK, a charge storing layer CIL, and a tunneling insulating layer TIL, which are sequentially stacked. The blocking insulating layer BLK may be provided to cover an inner side surface of each of the vertical channel holes CH. The tunneling insulating layer TIL may be provided adjacent to the vertical semiconductor pattern VSP. The charge storing layer CIL may be interposed between the blocking insulating layer BLK and the tunneling insulating layer TIL.

The blocking insulating layer BLK, the charge storing layer CIL, and the tunneling insulating layer TIL may be extended from a region between the stack structure ST and the vertical semiconductor pattern VSP in the third direction D3. In some example embodiments, the Fowler-Nordheim (FN) tunneling phenomenon, which is caused by a voltage difference between the vertical semiconductor pattern VSP and the first and second gate electrodes ELa and ELb, may be used to store or change data in the data storage pattern DSP. In some example embodiments, the blocking insulating layer BLK and the tunneling insulating layer TIL may be formed of or include silicon oxide, and the charge storing layer CIL may be formed of or include silicon nitride or silicon oxynitride.

The gapfill insulating pattern VI may be formed of or include silicon oxide. The conductive pad PAD may be formed of or include at least one of doped semiconductor materials or conductive materials.

Each of the vertical channel structures VS may include the first vertical channel structure VSa, which is provided in a first vertical channel hole CHa and the second vertical channel structure VSb, which is provided in a second vertical channel hole CHb. The second vertical channel structure VSb may be provided on and connected to the first vertical channel structure VSa.

Referring to FIG. 7A, the first seed pattern PSP1 of the seed layer PSL may be in contact with a side surface of the second vertical channel structure VSb. The first seed pattern PSP1 may include a first portion Pa, which covers at least a portion of a top surface VSat of the first vertical channel structure VSa, and a second portion Pb, which is extended from the first portion Pa in the first direction D1 (e.g., in a horizontal direction). The first portion Pa of the first seed pattern PSP1 may be provided such that its lower width W1 (e.g., a lower width of the first portion Pa) is larger than its upper width W2 (e.g., an upper width of the first portion Pa). A thickness of the second portion Pb in the third direction D3 may be substantially uniform.

In some example embodiments, a portion of a top surface VSat of the first vertical channel structure VSa is in contact with a bottom surface of the first seed pattern PSP1. Here, as shown in FIG. 7A, a bottom surface PSLb of the seed layer PSL, which may be a bottom surface of the first seed pattern PSP1, may be in contact with the top surface VSat of the first vertical channel structure VSa. A top surface PSLt of the seed layer PSL may be located at a level higher than the top surface VSat of the first vertical channel structure VSa.

Figure 7B:
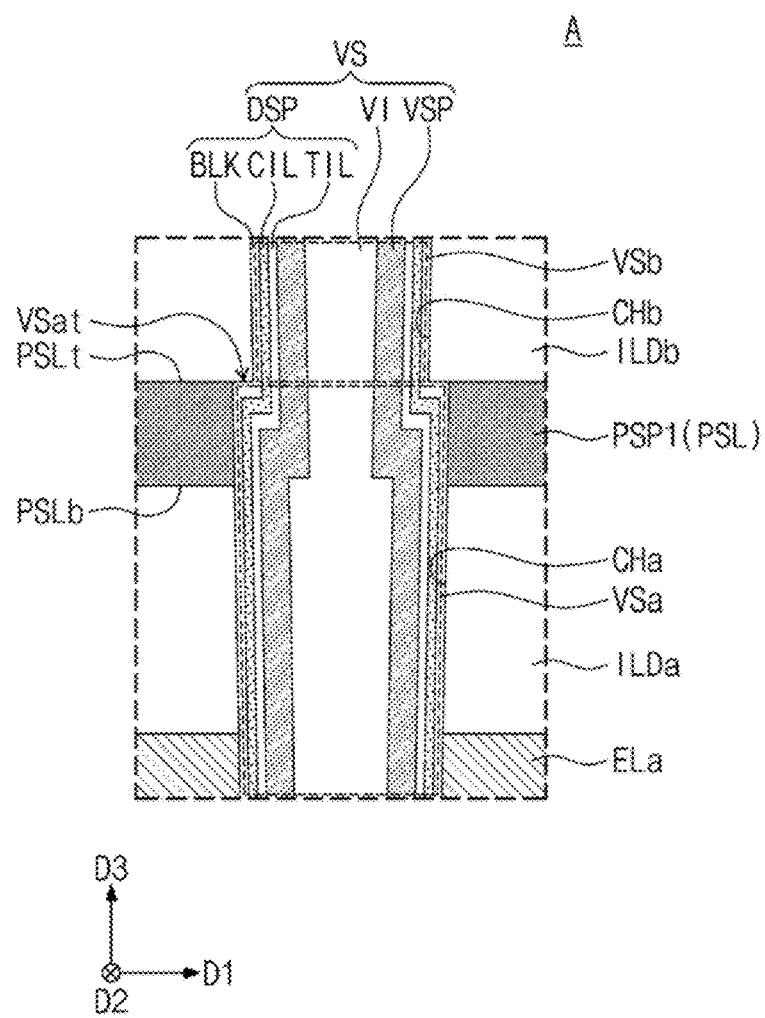

Referring to FIG. 7B, the first seed pattern PSP1 of the seed layer PSL may be in contact with a side surface of the first vertical channel structure VSa. Here, the bottom surface PSLb of the seed layer PSL may be located at a level lower than the top surface VSat of the first vertical channel structure VSa, and the top surface PSLt of the seed layer PSL (e.g., a top surface of the first seed pattern PSP1) may be coplanar or substantially coplanar with the top surface VSat of the first vertical channel structure VSa.

Figure 7C:
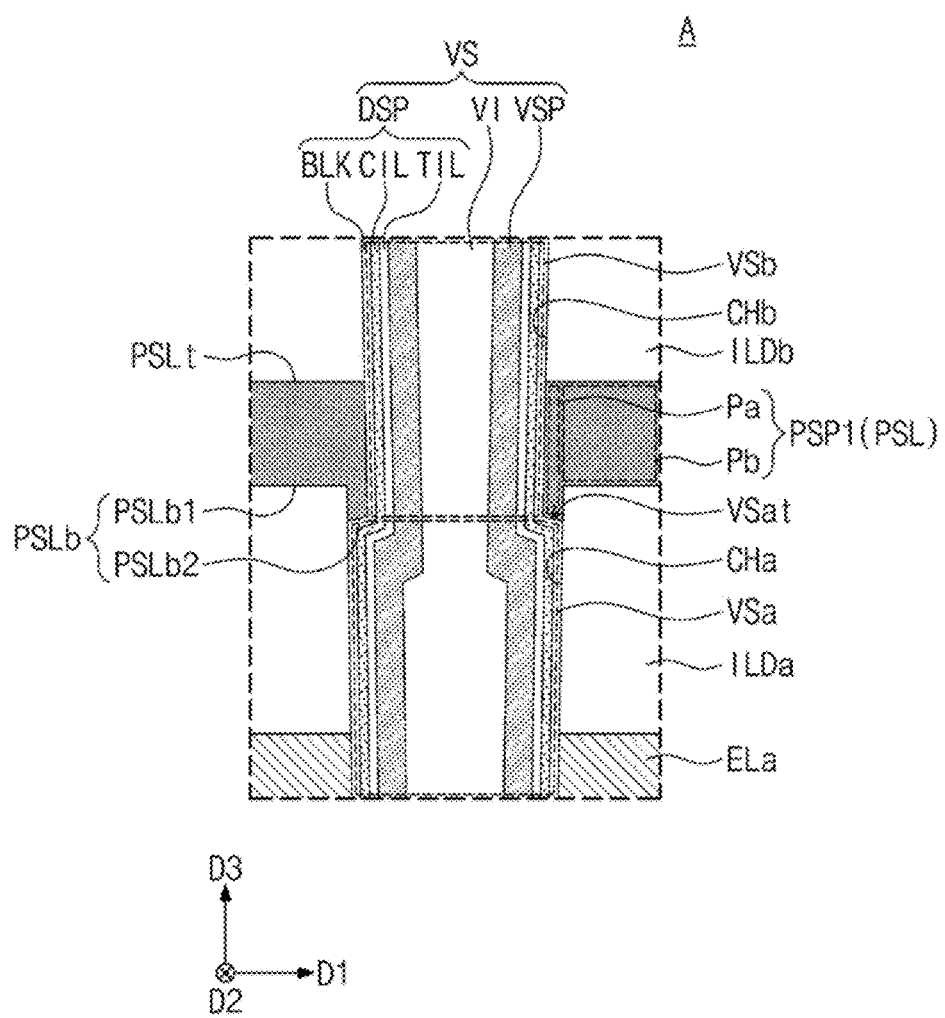

Referring to FIG. 7C, the first seed pattern PSP1 of the seed layer PSL may be in contact with the side surface of the second vertical channel structure VSb. The first seed pattern PSP1 may include the first portion Pa, which covers at least a portion of the top surface VSat of the first vertical channel structure VSa, and the second portion Pb, which is extended from the first portion Pa in the first direction D1. A thickness of the first portion Pa of the first seed pattern PSP1 may be larger than a thickness of the second portion Pb.

Here, the bottom surface PSLb of the seed layer PSL may include a first surface PSLb1, which corresponds to a bottom surface of the second portion Pb of the first seed pattern PSP1, and a second surface PSLb2, which corresponds to a bottom surface of the first portion Pa of the first seed pattern PSP1. The first surface PSLb1 may be located at a level higher than the top surface VSat of the first vertical channel structure VSa. The second surface PSLb2 may be located at a level lower than the first surface PSLb1 and may be in contact with the top surface VSat of the first vertical channel structure VSa. In some example embodiments, the second surface PSLb2 may be a curved surface. The top surface PSLt of the seed layer PSL may be located at a level higher than the first surface PSLb1 of the bottom surface PSLb. As shown in FIG. 7C, a bottom surface of the first portion Pa (e.g., PSLb2) may be located at a lower level than a bottom surface of the second portion Pb (e.g., PSLb1).

Figure 7D:
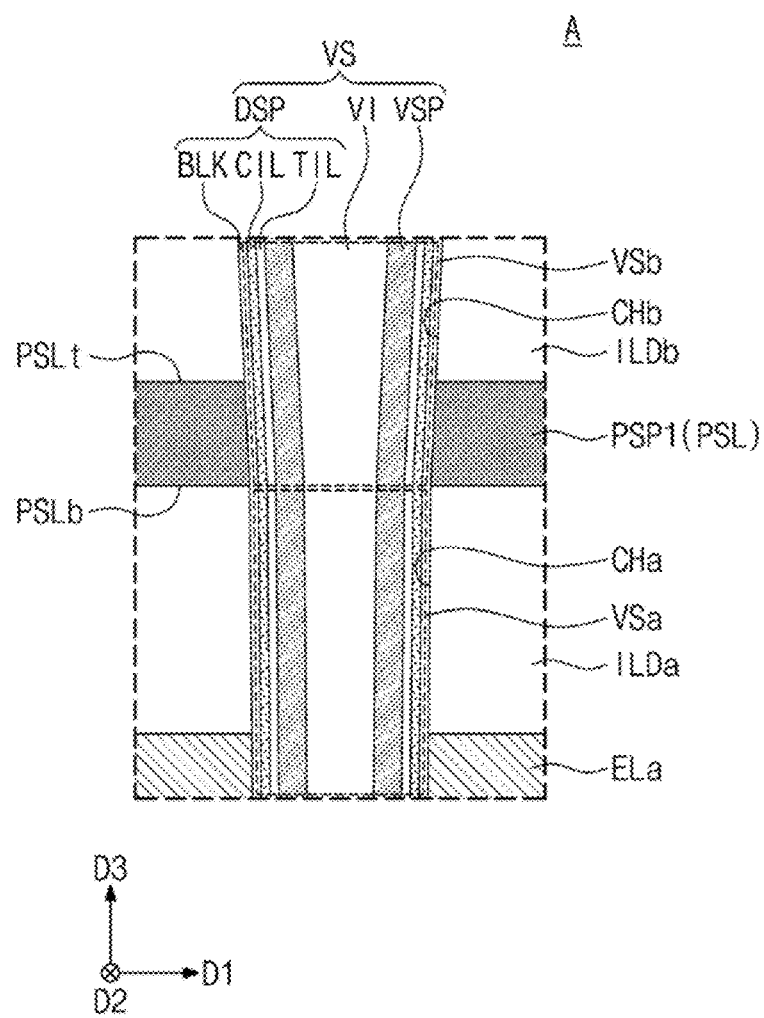

Referring to FIG. 7D, the first seed pattern PSP1 of the seed layer PSL may be in contact with the side surface of the second vertical channel structure VSb. A slope of the side surface of the first vertical channel structure VSa may be different from a slope of the side surface of the second vertical channel structure VSb. As an example, the slope of the side surface of the first vertical channel structure VSa may be smaller than the slope of the side surface of the second vertical channel structure VSb.

FIGS. 8A, 8B, 8C, and 8D are enlarged views, each of which illustrates a portion (e.g., a portion B of FIG. 6) of a three-dimensional semiconductor memory device according to some example embodiments of the inventive concepts. In the following description, an element previously described with reference to the above figures may be identified by the same reference number without repeating an overlapping description thereof, for concise description.

Figure 8A:
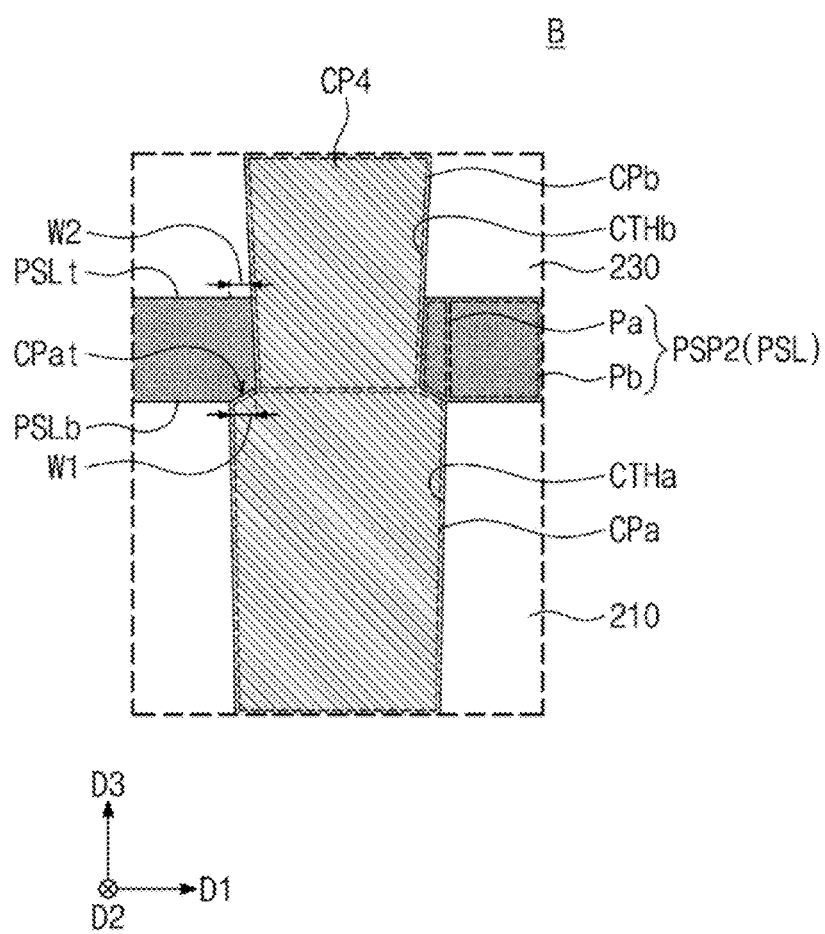
FIGS. 8A, 8B, 8C, and 8D are enlarged views, each of which illustrates a portion (e.g., a portion B of FIG. 6) of a three-dimensional semiconductor memory device according to some example embodiments of the inventive concepts.

Referring to FIGS. 6 and 8A, each of the first to fourth contact plugs CP1, CP2, CP3, and CP4 may include the first conductive structure CPa provided in a first contact hole CTHa and the second conductive structure CPb provided in a second contact hole CTHb. The second conductive structure CPb may be provided on and connected to the first conductive structure CPa.

Hereinafter, a portion of the fourth contact plug CP4 will be described in more detail, but the first to third contact plugs CP1, CP2, and CP3 may be provided to have the same or substantially the same features as the fourth contact plug CP4. In some example embodiments, the three-dimensional semiconductor memory device may be provided to include a plurality of the second seed patterns PSP2, and for brevity's sake, just one of the second seed patterns PSP2 will be described in more detail below. The others of the second seed patterns PSP2 may be provided to have the same or substantially the same features as those in the following description.

Referring to FIG. 8A, the second seed pattern PSP2 of the seed layer PSL may be in contact with a side surface of the second conductive structure CPb. The second seed pattern PSP2 may include the first portion Pa, which covers at least a portion of a top surface CPat of the first conductive structure CPa, and the second portion Pb, which is extended from the first portion Pa in the first direction D1. Referring to FIG. 8A, a portion of a top surface CPat of the first conductive structure CPa of the first contact plug CP1 may be in contact with a bottom surface of the second seed pattern PSP2 that encloses the first contact plug CP1, and a portion of a top surface CPat of the first conductive structure CPa of each of the second, third, and/or fourth contact plugs CP2, CP3, and/or CP4 may be in contact with a bottom surface of the a separate second seed pattern PSP2 (e.g., third seed pattern) that is spaced apart from the second seed pattern PSP2 that encloses the first contact plug CP1. The first portion Pa of the second seed pattern PSP2 may be provided such that its lower width W1 is larger than its upper width W2. A thickness of the second portion Pb in the third direction D3 may be substantially uniform.

Here, the bottom surface PSLb of the seed layer PSL may be connected to the top surface CPat of the first conductive structure CPa. The top surface PSLt of the seed layer PSL may be located at a level higher than the top surface CPat of the first conductive structure CPa.

Figure 8B:
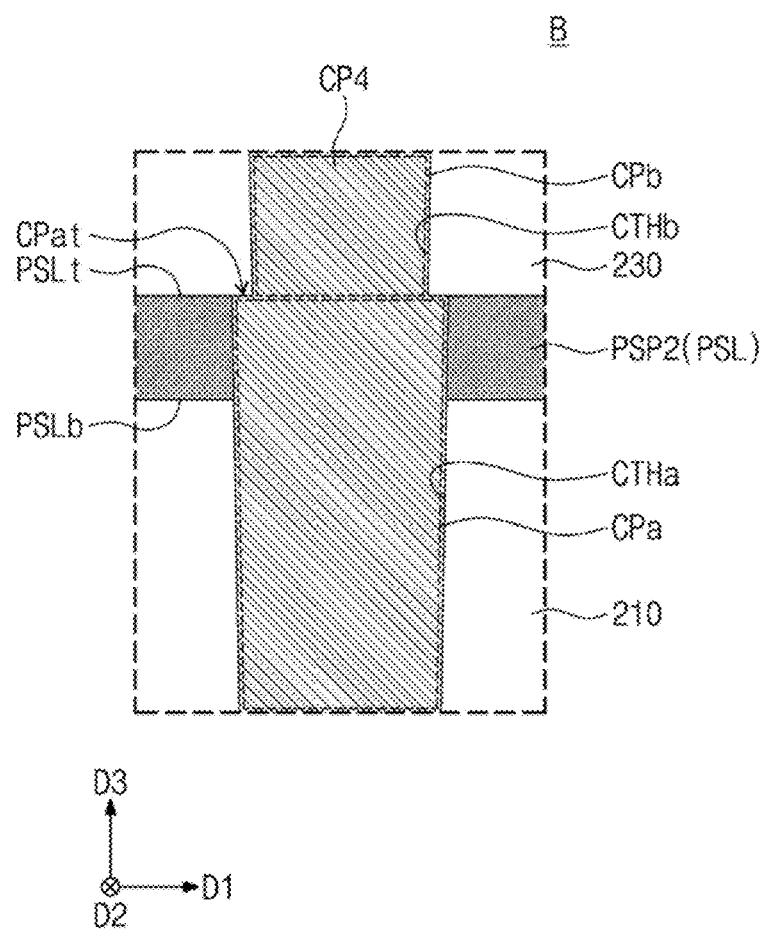

Referring to FIG. 8B, the second seed pattern PSP2 of the seed layer PSL may be in contact with a side surface of the first conductive structure CPa. Here, the bottom surface PSLb of the seed layer PSL may be located at a level lower than the top surface CPat of the first conductive structure CPa, and the top surface PSLt of the seed layer PSL may be coplanar or substantially coplanar with the top surface CPat of the first conductive structure CPa. Accordingly, each of the second seed patterns PSP2 (including second seed patterns referred to herein as third seed patterns) may be coplanar or substantially coplanar with the top surface CPat of the first conductive structure CPa of each of the first to fourth contact plugs CP1 to CP4.

Figure 8C:
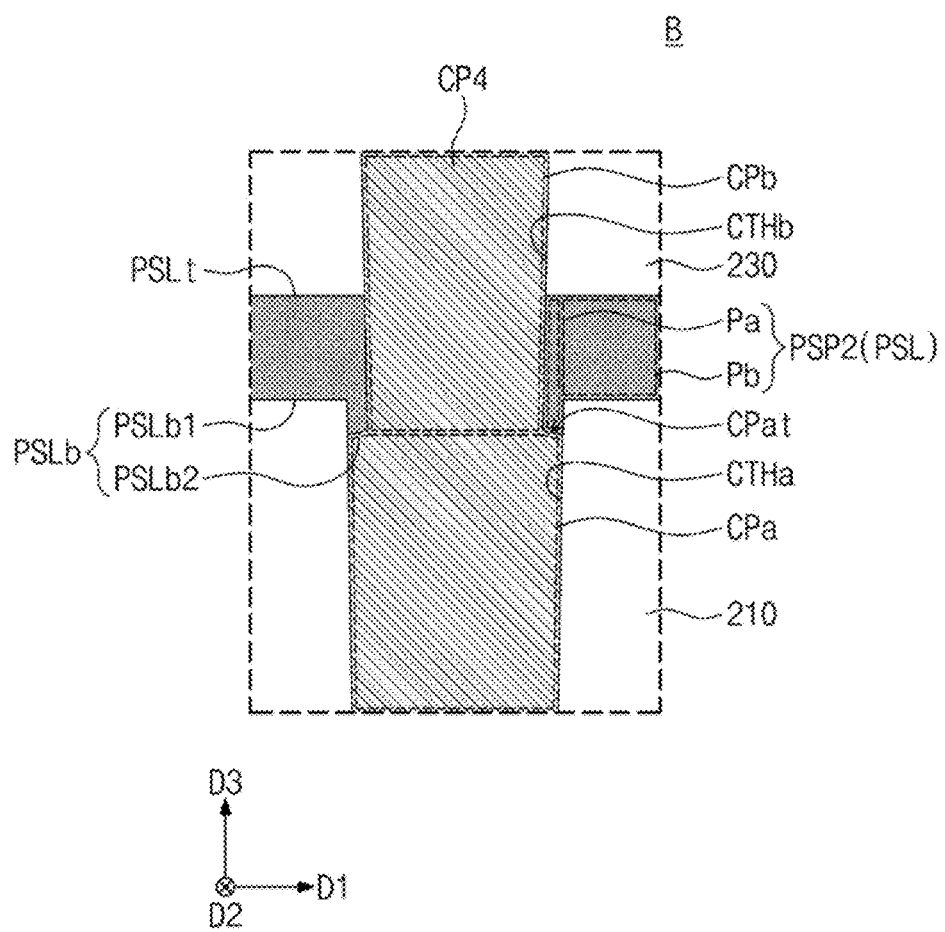

Referring to FIG. 8C, the second seed pattern PSP2 of the seed layer PSL may be in contact with the side surface of the second conductive structure CPb. The second seed pattern PSP2 may include the first portion Pa, which covers at least a portion of the top surface CPat of the first conductive structure CPa (e.g., is overlapped with the first conductive structure CPA in a vertical direction such as the third direction D3) and is in contact with a side surface of the second conductive structure CPb, and the second portion Pb, which is extended from the first portion Pa in the first direction D1. A lower width of the first portion Pa (e.g., width W1 as shown in FIG. 8A) may be larger than an upper width of the first portion Pa (e.g., width W2 as shown in FIG. 8A). A thickness of the first portion Pa of the second seed pattern PSP2 may be larger than a thickness of the second portion Pb.

Here, the bottom surface PSLb of the seed layer PSL may include the first surface PSLb1, which corresponds to a bottom surface of the second portion Pb of the second seed pattern PSP2, and the second surface PSLb2, which corresponds to a bottom surface of the first portion Pa of the second seed pattern PSP2. The first surface PSLb1 may be located at a level higher than the top surface CPat of the first conductive structure CPa. The second surface PSLb2 may be located at a level lower than the first surface PSLb1 and may be in contact with the top surface CPat of the first conductive structure CPa. Accordingly, a bottom surface of the first portion Pa (e.g., PSLb2) may be located at a lower level than a bottom surface of the second portion Pb (e.g., PSLb1). In some example embodiments, the second surface PSLb2 may be a curved surface. The top surface PSLt of the seed layer PSL may be located at a level higher than the first surface PSLb1 of the bottom surface PSLb.

Figure 8D:
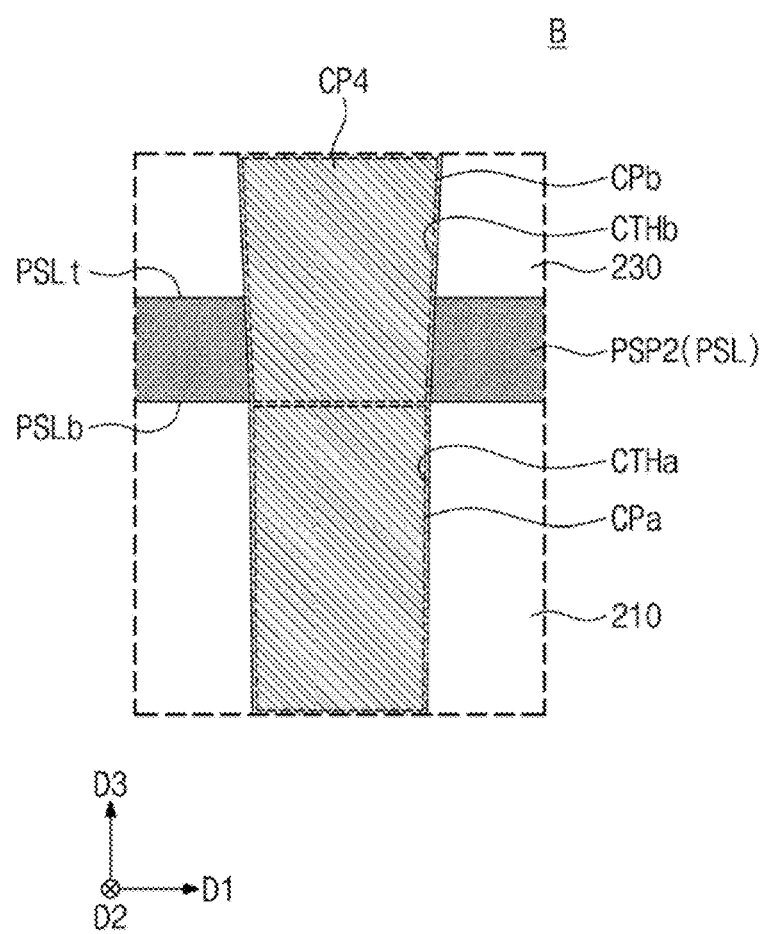

Referring to FIG. 8D, the second seed pattern PSP2 of the seed layer PSL may be in contact with the side surface of the second conductive structure CPb. A slope of the side surface of the first conductive structure CPa may be different from a slope of the side surface of the second conductive structure CPb. As an example, the slope of the side surface of the first conductive structure CPa may be smaller than the slope of the side surface of the second conductive structure CPb.

FIGS. 9, 10, 11, 12, 13, and 14 are sectional views, which are respectively taken along the line VI-VI' of FIG. 5 to illustrate a method of fabricating a three-dimensional semiconductor memory device according to some example embodiments of the inventive concepts. Hereinafter, the fabrication method will be described in more detail with reference to FIGS. 9 to 14.

Figure 9:
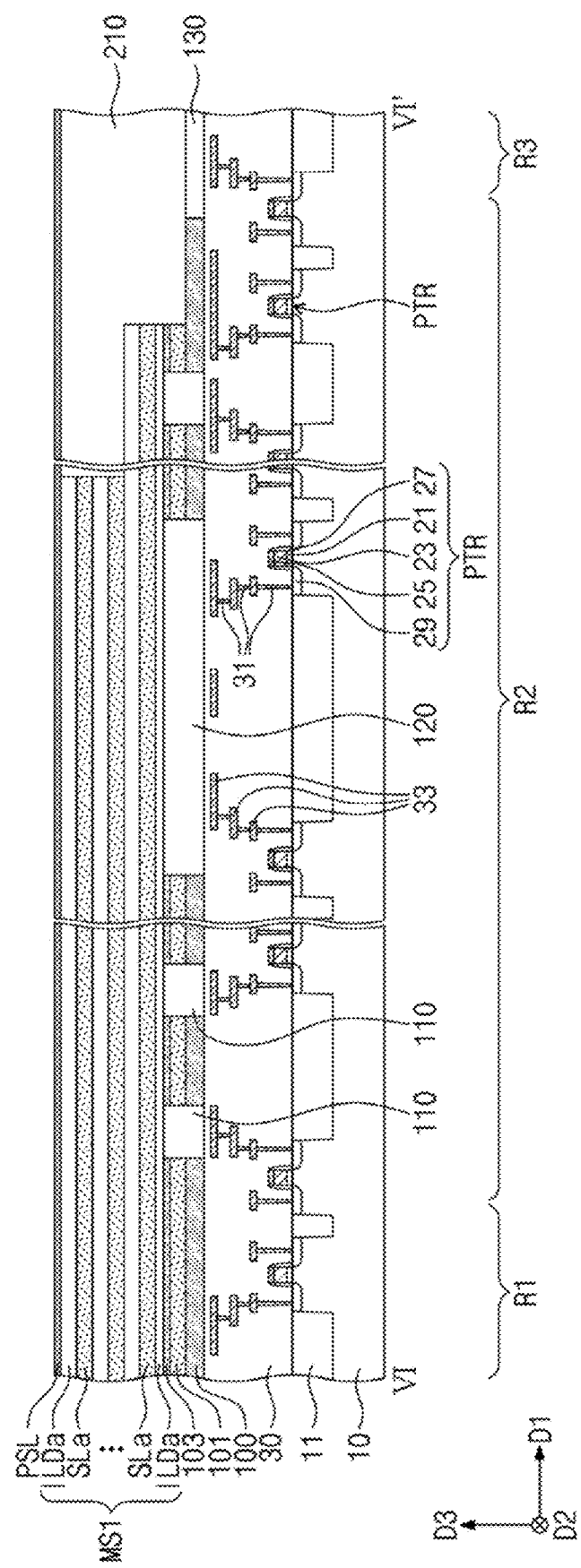
FIGS. 9, 10, 11, 12, 13, and 14 are sectional views, which are respectively taken along the line VI-VI' of FIG. 5 to illustrate a method of fabricating a three-dimensional semiconductor memory device according to some example embodiments of the inventive concepts.

Referring to FIG. 9, the first substrate 10 including the first region R1, the second region R2, and the third region R3 may be provided. The device isolation layer 11 may be formed in the first substrate 10 to define an active region. The formation of the device isolation layer 11 may include forming a trench in an upper portion of the first substrate 10 and filling the trench with a silicon oxide layer.

The peripheral transistors PTR may be formed on the active region defined by the device isolation layer 11. The peripheral contact plugs 31 and the peripheral circuit lines 33 may be formed to be connected to the peripheral source/drain regions 29 of the peripheral transistors PTR. The first insulating layer 30 may be formed to cover the peripheral transistors PTR, the peripheral contact plugs 31, and the peripheral circuit lines 33.

The second substrate 100 and the second insulating layer 130 may be formed on the first insulating layer 30. The formation of the second insulating layer 130 may include depositing a semiconductor material on the first insulating layer 30, removing the semiconductor material from the third region R3, filling a space, which is formed by removing the semiconductor material, with an insulating material, and performing a planarization process. The second insulating layer 130 may be formed to define a region, in which the fourth contact plug CP4 described above will be formed. The top surface of the second insulating layer 130 may be coplanar or substantially coplanar with the top surface of the second substrate 100. In the following description, the expression of "two elements are coplanar or substantially coplanar with each other" may mean that a planarization process may be performed on the elements. The planarization process may be performed using, for example, a chemical mechanical polishing (CMP) process or an etch-back process.

A lower sacrificial layer 101 and a lower semiconductor layer 103 may be formed on the second substrate 100. The lower sacrificial layer 101 may be formed of or include silicon nitride. In some example embodiments, the lower sacrificial layer 101 may be formed by sequentially stacking a plurality of insulating layers. In some example embodiments, the lower semiconductor layer 103 may be formed of the same material as the second substrate 100.

The first and second insulating patterns 110 and 120 may be formed in the second substrate 100. The formation of the first and second insulating patterns 110 and 120 may include patterning the second substrate 100, the lower sacrificial layer 101, and the lower semiconductor layer 103 and filling a space, which is formed by removing each of the second substrate 100, the lower sacrificial layer 101, and the lower semiconductor layer 103, with an insulating material. The first insulating patterns 110 may be formed to define a region, in which the first contact plugs CP1 described above will be formed, and the second insulating pattern 120 may be formed to define a region, in which the second contact plug CP2 described above will be formed. The first and second insulating patterns 110 and 120 may be formed to have top surfaces which are coplanar or substantially coplanar with the top surface of the lower semiconductor layer 103.

A first mold structure MS1 may be formed on the lower semiconductor layer 103. The formation of the first mold structure MS1 may include alternately and repeatedly stacking the first interlayer dielectric layers ILDa and the first sacrificial layers SLa on the lower semiconductor layer 103 and performing a trimming process on the first interlayer dielectric layers ILDa and the first sacrificial layers SLa.

The first sacrificial layers SLa may be formed of or include an insulating material different from the first interlayer dielectric layers ILDa. The first sacrificial layers SLa may be formed of or include a material having an etch selectivity with respect to the first interlayer dielectric layers ILDa. For example, the first sacrificial layers SLa may be formed of or include silicon nitride, and the first interlayer dielectric layers ILDa may be formed of or include silicon oxide. All of the first sacrificial layers SLa may be formed to have the same or substantially the same thickness, and the first interlayer dielectric layers ILDa may be formed to have at least two different thicknesses according to their vertical positions.

The trimming process may include forming a mask pattern to cover a top surface of the uppermost one of the first interlayer dielectric layers ILDa on the first and second regions R1 and R2, patterning some of the first interlayer dielectric layers ILDa and the first sacrificial layers SLa using the mask pattern as an etching mask, reducing an area of the mask pattern, and patterning others of the first interlayer dielectric layers ILDa and the first sacrificial layers SLa using the reduced mask pattern as an etching mask. The step of reducing of the area of the mask pattern and the patterning step may be alternately repeated. As a result of the trimming process, the first mold structure MS1 may have a staircase structure.

The third insulating layer 210 may be formed to cover the staircase structure of the first mold structure MS1 on the second region R2 and to cover the second substrate 100 and the second insulating layer 130 on the third region R3. The third insulating layer 210 may be formed to have a top surface, which is coplanar or substantially coplanar with the top surface of the first mold structure MS1.

The seed layer PSL may be formed to cover the first mold structure MS1 and the third insulating layer 210. In some example embodiments, the seed layer PSL may be formed of or include poly silicon. A thickness of the seed layer PSL may range from about 900 Å to 1500 Å.

Figure 10:
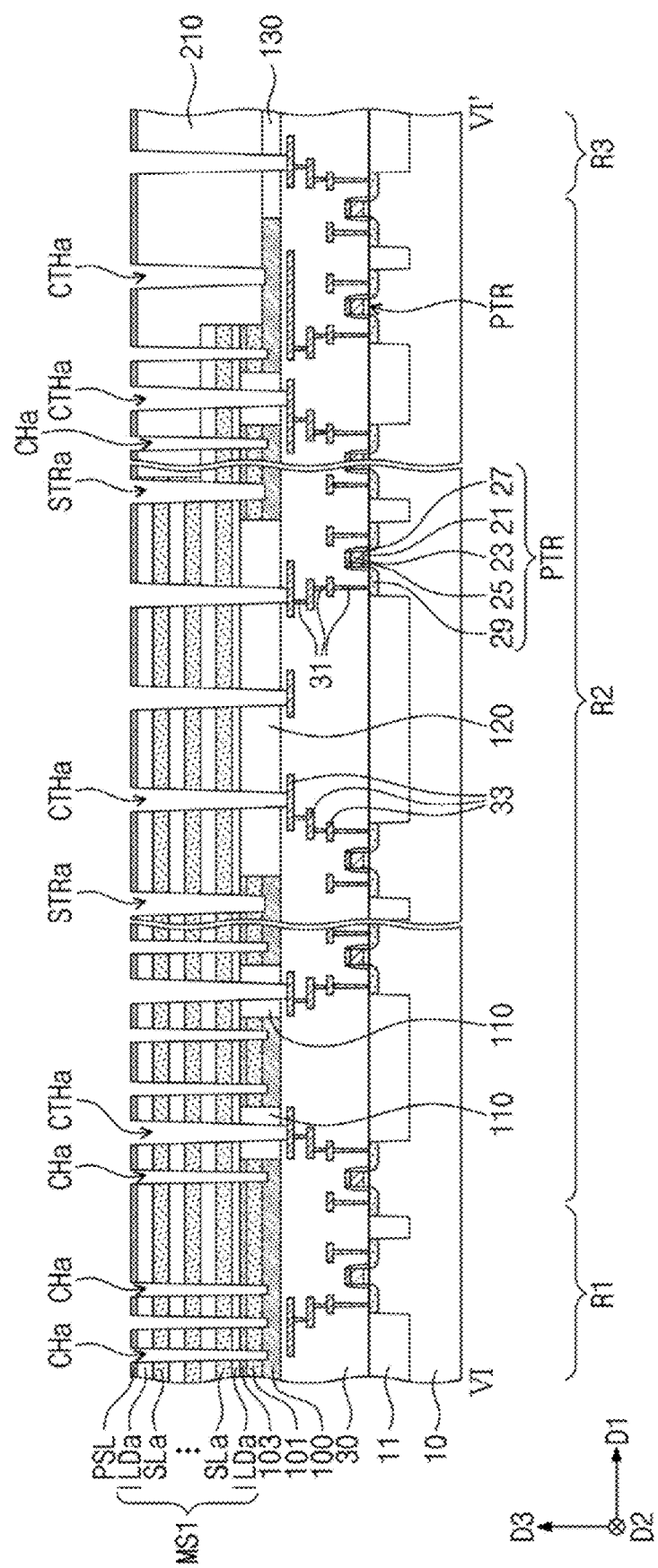

Referring to FIG. 10, an etching process may be performed on the seed layer PSL, the first mold structure MS1, the lower semiconductor layer 103, and the lower sacrificial layer 101 to form the first vertical channel holes CHa, the first contact holes CTHa, and the first mold separation trench STRa. The first contact holes CTHa may be formed to penetrate the first and second insulating patterns 110 and 120 and the second insulating layer 130.

An upper diameter of the first contact hole CTHa may be larger than an upper diameter of the first vertical channel hole CHa. For example, the upper diameter of the first contact hole CTHa may be about 1.5 to 3 times the upper diameter of the first vertical channel hole CHa. A depth of the first contact hole CTHa in the third direction D3 may be larger than a depth of the first vertical channel hole CHa in the third direction D3.

Figure 11:
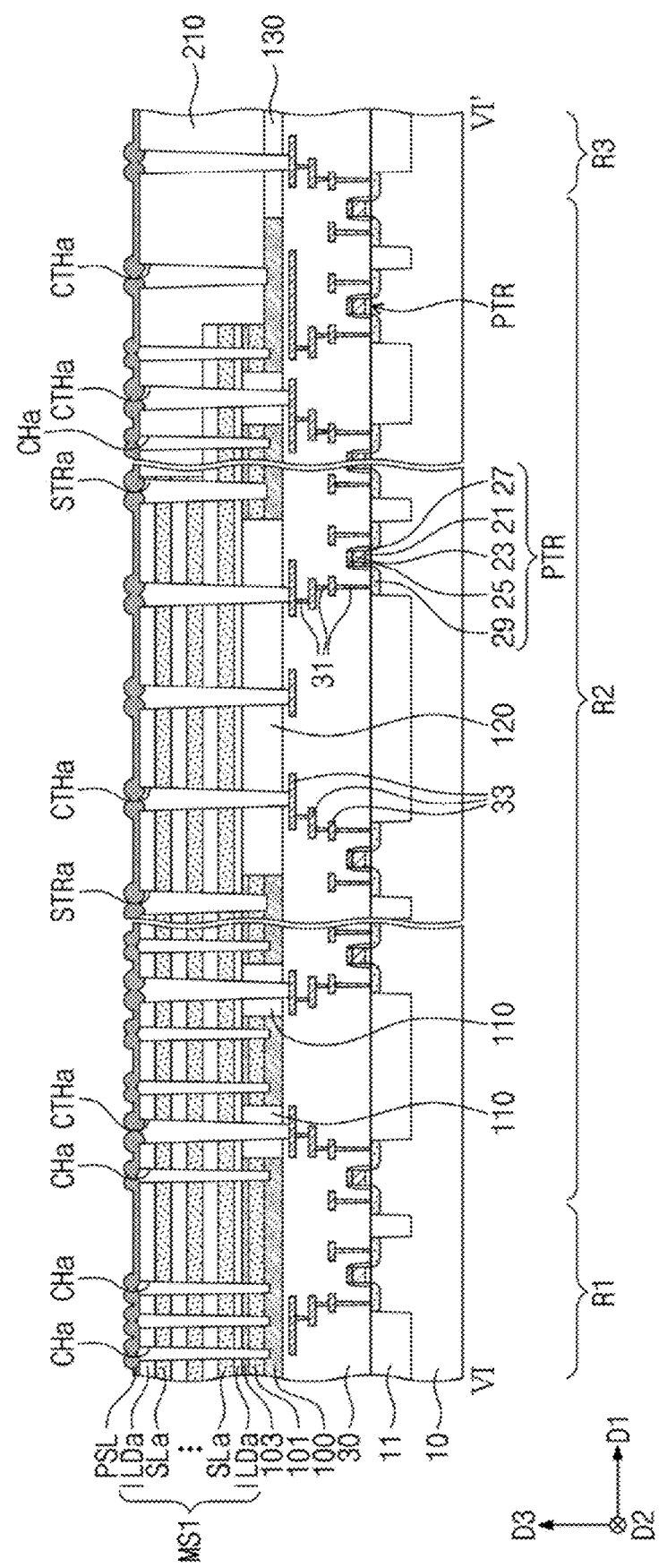

Referring to FIG. 11, a selective epitaxial growth (SEG) process may be performed using the seed layer PSL, which is left on the first mold structure MS1, as a seed layer, after the etching process described with reference to FIG. 10. In some example embodiments, the SEG process may be performed to cover an upper portion of each of the first vertical channel holes CHa, the first contact holes CTHa, and the first mold separation trench STRa with the seed layer PSL, and in this case, an inner space of each of the first vertical channel holes CHa, the first contact holes CTHa, and the first mold separation trench STRa may be left as an empty space that is isolated from the outside.

Figure 12:
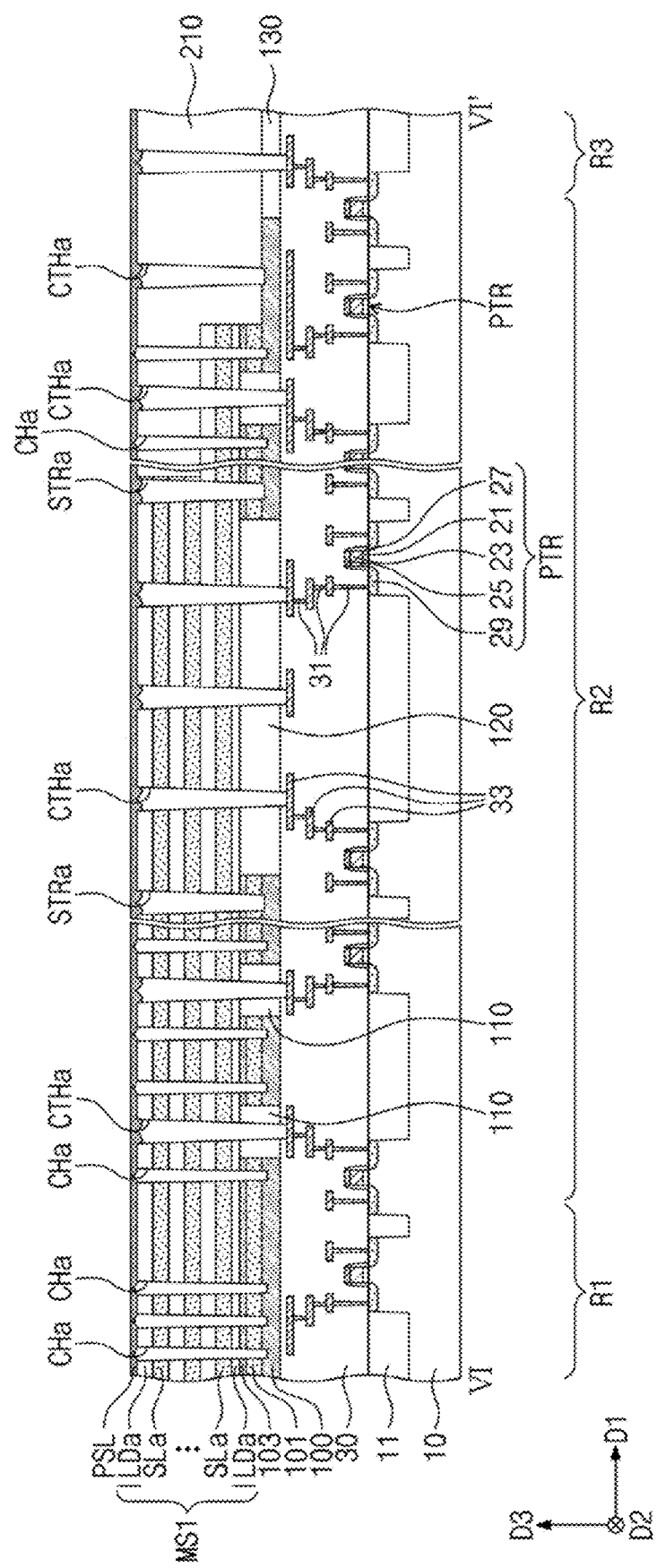

Referring to FIG. 12, a planarization process may be performed on the seed layer PSL, after the SEG process described with reference to FIG. 11. In some example embodiments, when the planarization process is finished, the seed layer PSL may be left to cover the upper portion of each of the first vertical channel holes CHa, the first contact holes CTHa, and the first mold separation trench STRa. Here, the top surface of the seed layer PSL may have a substantially flat or planarized shape. In other words, the top surface of the seed layer PSL may be substantially parallel to the top surface of the first substrate 10.

Figure 13:
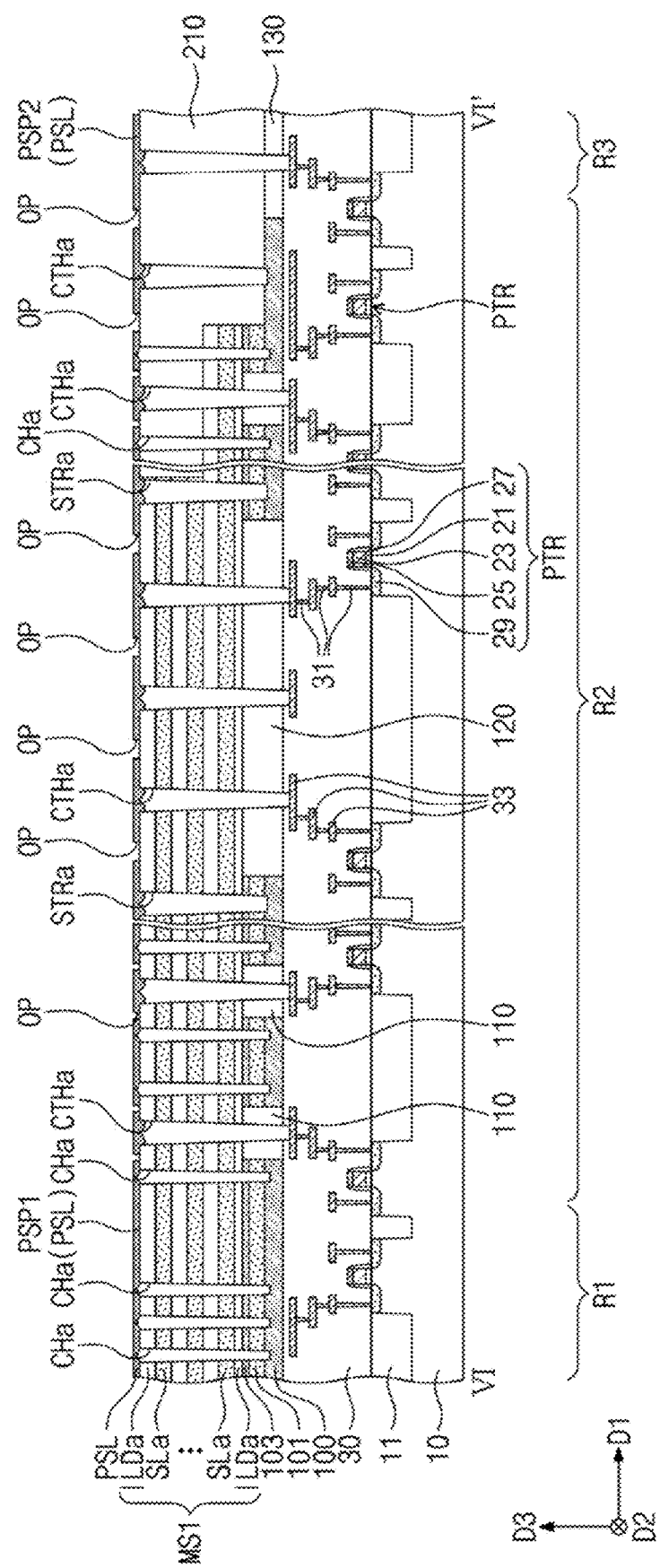

Referring to FIG. 13, openings OP may be formed around the first contact holes CTHa, after the planarization process described with reference to FIG. 12. The openings OP may be formed to enclose the first contact holes CTHa. As a result of the formation of the openings OP, the seed layer PSL may be divided into the first seed pattern PSP1, which is formed on the first region R1 to cover the upper portions of the first vertical channel holes CHa, and the second seed patterns PSP2, which are formed on the second and third regions R2 and R3 to cover the upper portions of the first vertical channel holes CHa, the first contact holes CTHa and the first mold separation trench STRa.

Figure 14:
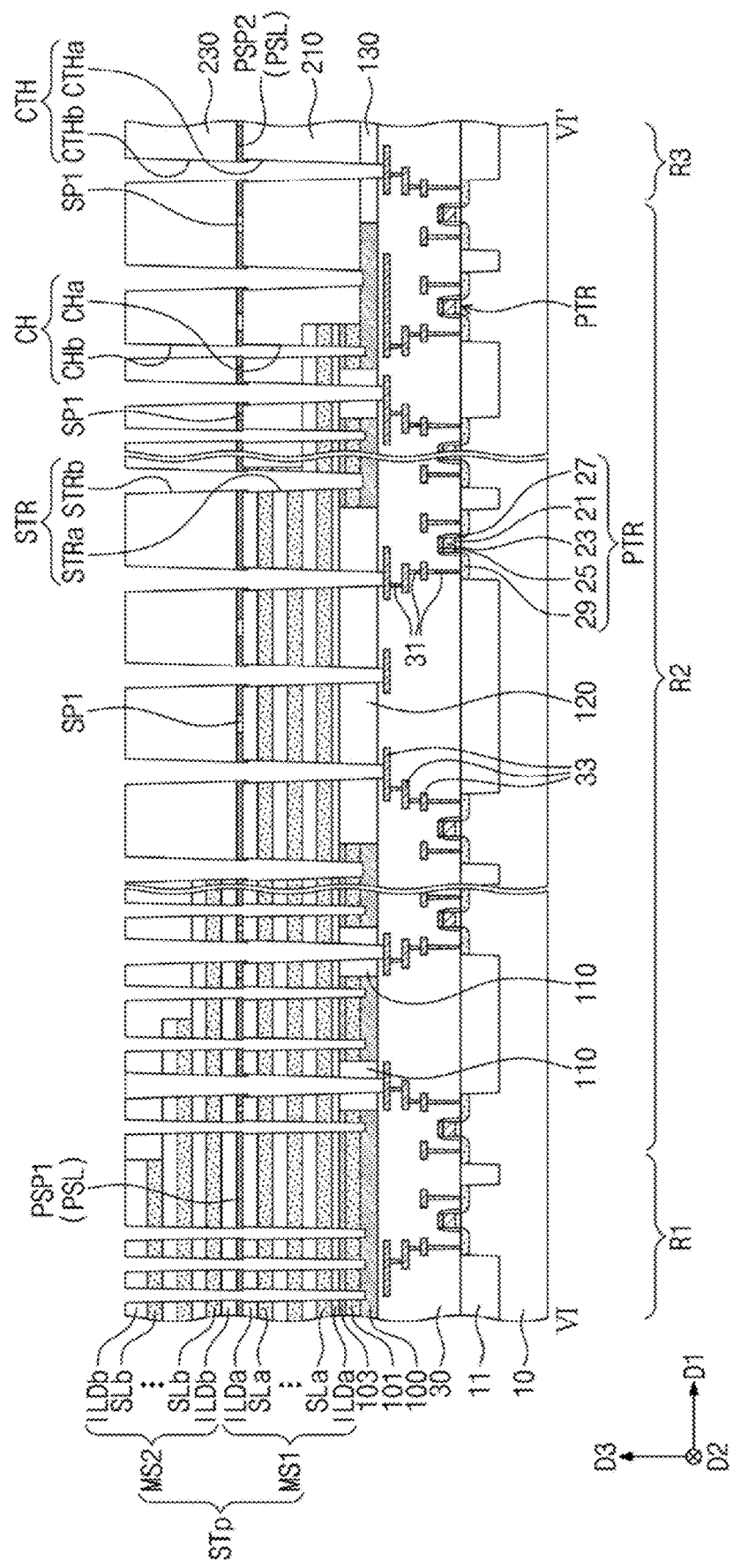

Referring to FIG. 14, the first separation insulating patterns SP1 may be formed to fill the openings OP. Each of the first separation insulating patterns SP1 may be formed to have a top surface, which is coplanar or substantially coplanar with the top surfaces of the first and second seed patterns PSP1 and PSP2 of the seed layer PSL.

A second mold structure MS2 and the fourth insulating layer 230 may be formed on the first and second seed patterns PSP1 and PSP2 of the seed layer PSL and the first separation insulating patterns SP1. The formation of the second mold structure MS2 may include alternately and repeatedly stacking the second interlayer dielectric layers ILDb and second sacrificial layers SLb on the first and second seed patterns PSP1 and PSP2 and performing a trimming process on the second interlayer dielectric layers ILDb and the second sacrificial layers SLb.

Thereafter, the second vertical channel holes CHb, the second contact holes CTHb, and the second mold separation trench STRb may be formed to be overlapped with the first vertical channel holes CHa, the first contact holes CTHa, and the first mold separation trench STRa, respectively, in the third direction D3. As a result, the vertical channel holes CH including the first and second vertical channel holes CHa and CHb, the contact holes CTH including the first and second contact holes CTHa and CTHb, and the mold separation trench STR including the first and second mold separation trenches STRa and STRb may be formed.

Meanwhile, FIG. 14 illustrates a structure of a chip center region CCR of FIG. 2, and for a chip edge region CER of FIG. 2, the seed layer PSL may not be etched in the process of forming the second vertical channel holes CHb and the second contact holes CTHb. This means that, in the chip edge region CER, the first and second vertical channel holes CHa and CHb may not be connected to each other and the first and second contact holes CTHa and CTHb may not be connected to each other.

As a result of the afore-described SEG process, the second seed patterns PSP2 may be partially left on the side surfaces of the first contact holes CTHa (i.e., at a level lower than the top surface of the first mold structure MS1). However, since the upper portion of each of the first vertical channel holes CHa, the first contact holes CTHa, and the first mold separation trench STRa is covered by a layer formed through the afore-described SEG process and then the second mold structure MS2 is formed thereon, it may be possible to reduce, prevent, or suppress a semiconductor material from being left on bottom surfaces of the vertical channel holes CH and the contact holes CTH. In addition, since the vertical channel holes CH and the contact holes CTH are formed at the same time, it may be possible to simplify the fabrication process.

Referring back to FIGS. 5 and 6, the vertical channel structures VS or the dummy vertical channel structures DVS may be formed in the vertical channel holes CH, the first to fourth contact plugs CP1, CP2, CP3, and CP4 may be formed in the contact holes CTH, and the mold separation pattern MSP may be formed in the mold separation trench STR.

Since the semiconductor material is reduced or prevented from being left on the bottom surfaces of the vertical channel holes CH and the contact holes CTH, it may be possible to improve electrical characteristics of the vertical channel structures VS and the first to fourth contact plugs CP1, CP2, CP3, and CP4 and to improve reliability in electric connection between them and other elements. As a result, it may be possible to improve the reliability and electrical characteristics of the three-dimensional semiconductor memory device according to some example embodiments of the inventive concepts.

Figure 15:
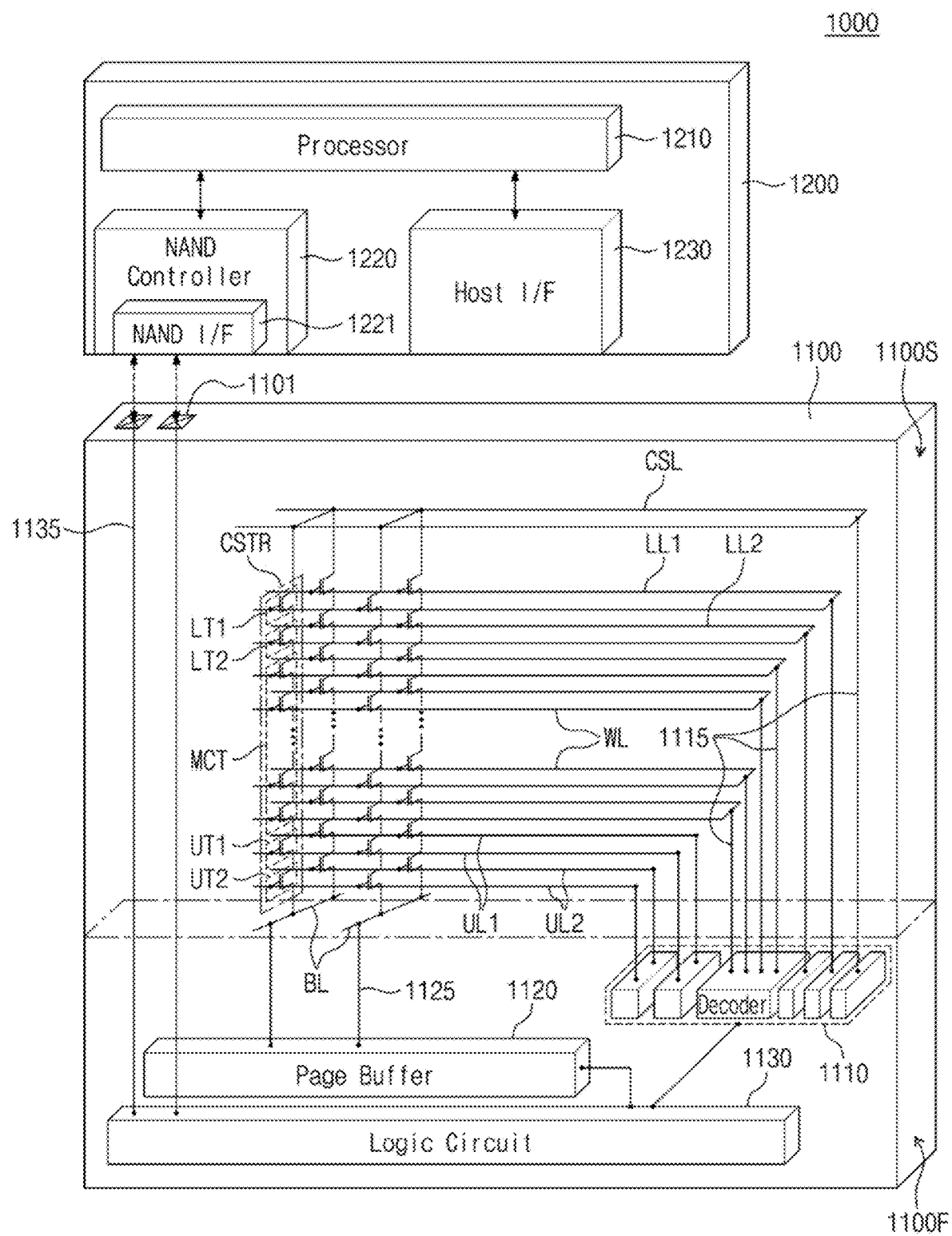
FIG. 15 is a schematic diagram illustrating an electronic system including a three-dimensional semiconductor memory device according to some example embodiments of the inventive concepts.
Figure 16:
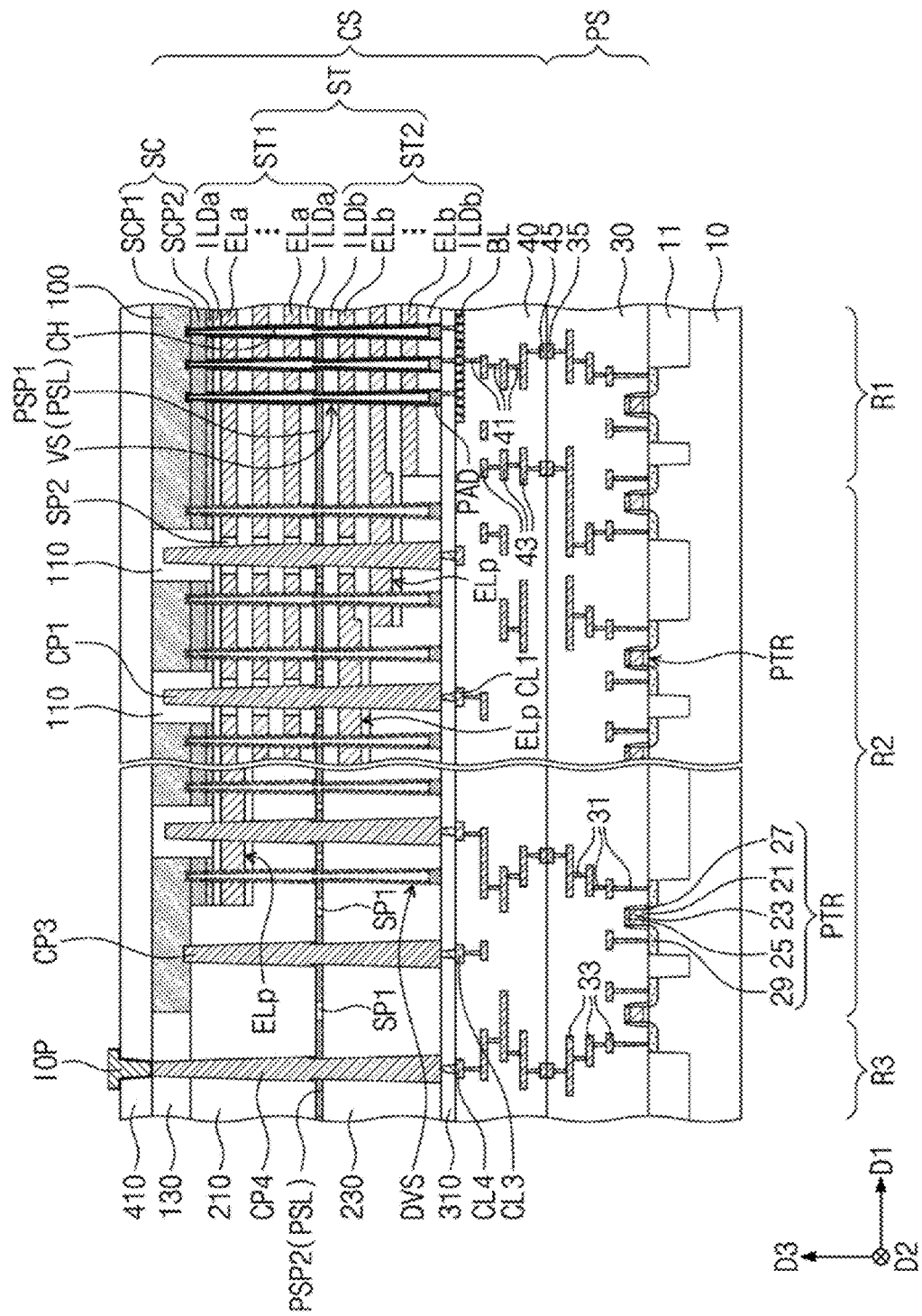
FIG. 16 is a sectional view illustrating a three-dimensional semiconductor memory device according to some example embodiments of the inventive concepts.

FIG. 15 is a schematic diagram illustrating an electronic system including a three-dimensional semiconductor memory device according to some example embodiments of the inventive concepts. FIG. 16 is a sectional view illustrating a three-dimensional semiconductor memory device according to some example embodiments of the inventive concepts. A three-dimensional semiconductor memory device 1100 included in the electronic system 1000 of FIG. 15 may be a three-dimensional semiconductor memory device according to any of the example embodiments.

Referring to FIG. 15, the memory cell strings CSTR may be located between the common source line CSL and the first region 1100F. The bit lines BL may be located between the memory cell strings CSTR and the first region 1100F.

Referring to FIG. 16, the peripheral circuit structure PS, which includes the peripheral transistors PTR, the peripheral contact plugs 31, the peripheral circuit lines 33 electrically connected to the peripheral transistors PTR through the peripheral contact plugs 31, first bonding pads 35 electrically connected to the peripheral circuit lines 33 (and thus connected to the peripheral transistors PTR), and the first insulating layer 30 enclosing them, may be provided on the first substrate 10. The first insulating layer 30 may not cover top surfaces of the first bonding pads 35. The first insulating layer 30 may have a top surface that is coplanar or substantially coplanar with the top surfaces of the first bonding pads 35.

The cell array structure CS including second bonding pads 45, the bit lines BL, and the stack structure ST may be provided on the peripheral circuit structure PS.

The second bonding pads 45 in contact with the first bonding pads 35 of the peripheral circuit structure PS, connection contact plugs 41, connection circuit lines 43 electrically connected to the second bonding pads 45 through the connection contact plugs 41, and a seventh insulating layer 40 enclosing them may be provided on the first insulating layer 30.

The seventh insulating layer 40 may have a multi-layered structure including a plurality of insulating layers. For example, the seventh insulating layer 40 may be formed of or include at least one of silicon oxide, silicon nitride, silicon oxynitride, and/or low-k dielectric materials. The connection contact plugs 41 may have a decreasing width in the third direction D3. The connection contact plugs 41 and the connection circuit lines 43 may be formed of or include at least one of conductive materials (e.g., metallic materials).

A bottom surface of each of the second bonding pads 45 may be in direct contact with a top surface of each of the first bonding pads 35. Each second bonding pad 45 may be integrally connected to a separate first bonding pad 35 of the first bonding pads 35. The first and second bonding pads 35 and 45 may be formed of or include at least one of, for example, copper (Cu), tungsten (W), aluminum (Al), nickel (Ni), or tin (Sn). As an example, the first and second bonding pads 35 and 45 may be formed of or include copper (Cu). The first and second bonding pads 35 and 45 may be integrally bonded (e.g., integrally connected) to each other without any interface therebetween and may form a single object. The side surfaces of the first and second bonding pads 35 and 45 are illustrated to be aligned to each other, but the inventive concepts is not limited to this example. For example, the side surfaces of the first and second bonding pads 35 and 45 may be spaced apart from each other, when viewed in a plan view.

The bit lines BL and the first, third, and fourth conductive lines CL1, CL3, and CL4, which are in contact with the connection contact plugs 41 and may be understood to be connected to the second bonding pads 45, may be provided in an upper portion of the seventh insulating layer 40. The stack structure ST, the vertical channel structures VS electrically connected to the bit lines BL, and the first, third, and fourth contact plugs CP1, CP3, and CP4 electrically connected to corresponding ones of the first, third, and fourth conductive lines CL1, CL3, and CL4 may be provided on the seventh insulating layer 40. The conductive lines CL3, CL3, and CL4, may be electrically connected to the vertical channel structures VS and the contact plugs CP1, CP3, and CP4. Each of the vertical channel structures VS and the first, third, and fourth contact plugs CP1, CP3, and CP4 may have a decreasing width in the third direction D3.

On the second region R2, a thickness of each of the first and second stack structures ST1 and ST2 in the third direction D3 may decrease with increasing distance from the outermost one of the vertical channel structures VS. That is, each of the first and second stack structures ST1 and ST2 may have a staircase structure in the first direction D1.

More specifically, lengths of the first gate electrodes ELa of the first stack structure ST1 and the second gate electrodes ELb of the second stack structure ST2 in the first direction D1 may increase with increasing distance from the first substrate 10. The side surfaces of the first and second gate electrodes ELa and ELb may be spaced apart from each other in the first direction D1 by a specific distance, when viewed in a plan view. The lowermost one of the second gate electrodes ELb of the second stack structure ST2 may have the smallest length in the first direction D1, and the uppermost one of the first gate electrodes ELa of the first stack structure ST1 may have the largest length in the first direction D1.

The source structure SC and the second substrate 100 may be provided on the stack structure ST. In other words, the stack structure ST may be provided between the second substrate 100 and the peripheral circuit structure PS. An eighth insulating layer 410 may be provided on the second substrate 100. The input/output pad IOP, which is electrically connected to the peripheral circuit structure PS through the fourth contact plug CP4, and the fourth conductive line CL4 may be provided on the eighth insulating layer 410.

Since the cell array structure CS is coupled to the peripheral circuit structure PS, the three-dimensional semiconductor memory device may have an increased cell capacity per unit area. In addition, the peripheral circuit structure PS and the cell array structure CS may be separately fabricated and then may be coupled to each other, and in this case, it may be possible to reduce or prevent the peripheral transistors PTR from being damaged by several thermal treatment processes. Accordingly, the reliability and electrical characteristics of the three-dimensional semiconductor memory device may be improved.

According to some example embodiments of the inventive concepts, a selective epitaxial growth (SEG) process may be performed to seal or cover an upper portion of each of first vertical channel holes, first contact holes, and first mold separation trench, and then, a second mold structure may be formed thereon. Accordingly, it may be possible to reduce, prevent, or suppress a semiconductor material from being left on bottom surfaces of vertical channel holes and contact holes. Furthermore, it may be possible to improve electrical characteristics of vertical channel structures and contact plugs and reliability in electric connection between them and other elements. As a result, it may be possible to improve reliability and electrical characteristics of a three-dimensional semiconductor memory device according to some example embodiments of the inventive concepts.

In addition, it may be possible to form the vertical channel holes and the contact holes at the same time and thereby to simplify the fabrication process.

As described herein, any devices, packages, systems, electronic devices, blocks, modules, units, controllers, circuits, and/or portions thereof according to any of the example embodiments, and/or any portions thereof (including, without limitation, electronic system 1000, three-dimensional semiconductor memory device 1100, controller 1200, decoder circuit 1110, page buffer 1120, logic circuit 1130, processor 1210, NAND controller 1220, host interface 1230, electronic system 2000, main substrate 2001, controller 2002, semiconductor package 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, packages, systems, electronic devices, blocks, modules, units, controllers, circuits, and/or portions thereof according to any of the example embodiments, and/or any portions thereof.

Any of the memories and/or storage devices described herein, including, without limitation, semiconductor package 2003, DRAM 2004, or the like, may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a substrate;
   a stack structure including interlayer dielectric layers and gate electrodes, which are alternately and repeatedly stacked on the substrate, the stack structure including a first stack structure on the substrate and a second stack structure on the first stack structure;
   a seed layer between the first stack structure and the second stack structure and extended in a horizontal direction;
   vertical channel structures that penetrate the stack structure and are in contact with the substrate; and
   a first contact plug that penetrates the stack structure and is in contact with one of the gate electrodes,
   wherein each of the vertical channel structures comprises a first vertical channel structure penetrating the first stack structure and a second vertical channel structure penetrating the second stack structure, wherein the first vertical channel structure and the second vertical channel structure are connected to each other in a vertical direction, wherein the seed layer includes a first seed pattern enclosing the vertical channel structures and a second seed pattern enclosing the first contact plug, wherein the first seed pattern and the second seed pattern are spaced apart from each other in the horizontal direction, and wherein the first seed pattern comprises a first portion, which covers a portion of a top surface of the first vertical channel structure and a second portion, which is extended from the first portion in the horizontal direction.

2. The three-dimensional semiconductor memory device of claim 1, wherein a lower width of the first portion is larger than an upper width of the first portion.

3. The three-dimensional semiconductor memory device of claim 1, wherein a bottom surface of the first portion is located at a level lower than a bottom surface of the second portion.

4. The three-dimensional semiconductor memory device of claim 1, wherein
   a slope of a side surface of the first vertical channel structure is different from a slope of a side surface of the second vertical channel structure.

5. The three-dimensional semiconductor memory device of claim 1, further comprising:
   a second contact plug, which is spaced apart from the stack structure in the horizontal direction and is in contact with the substrate; and
   a third contact plug, which is spaced apart from the substrate in the horizontal direction,
   wherein each of the second contact plug and the third contact plug is in contact with a third seed pattern, which is spaced apart from the first seed pattern and the second seed pattern in the horizontal direction.

6. The three-dimensional semiconductor memory device of claim 5, wherein
   the first contact plug comprises a first conductive structure and a second conductive structure on the first conductive structure, the first conductive structure of the first contact plug and the second conductive structure of the first contact plug connected to each other in the vertical direction,
   the second contact plug comprises a first conductive structure and a second conductive structure on the first conductive structure, the first conductive structure of the second contact plug and the second conductive structure of the second contact plug connected to each other in the vertical direction,
   the third contact plug comprises a first conductive structure and a second conductive structure on the first conductive structure, the first conductive structure of the third contact plug and the second conductive structure of the third contact plug connected to each other in the vertical direction,
   a portion of a top surface of the first conductive structure of the first contact plug is in contact with a bottom surface of the second seed pattern, and
   a portion of a top surface of the first conductive structure of the second contact plug and a portion of a top surface of the first conductive structure of the third contact plug are each in contact with a bottom surface of the third seed pattern.

7. The three-dimensional semiconductor memory device of claim 6, wherein each of the second seed pattern and the third seed pattern comprises
   a first portion, which is overlapped with the first conductive structure in the vertical direction and is in contact with a side surface of the second conductive structure, and
   a second portion, which is extended from the first portion in the horizontal direction.

8. The three-dimensional semiconductor memory device of claim 7, wherein
   a lower width of the first portion of the second seed pattern is larger than an upper width of the first portion of the second seed pattern, and
   a lower width of the first portion of the third seed pattern is larger than an upper width of the first portion of the third seed pattern.

9. The three-dimensional semiconductor memory device of claim 7, wherein
   a bottom surface of the first portion of the second seed pattern is located at a level lower than a bottom surface of the second portion of the second seed pattern, and
   a bottom surface of the first portion of the third seed pattern is located at a level lower than a bottom surface of the second portion of the third seed pattern.

10. The three-dimensional semiconductor memory device of claim 6, wherein a top surface of each of the second seed pattern and the third seed pattern is coplanar with the top surface of the first conductive structure of each of the first contact plug, the second contact plug, and the third contact plug.

11. The three-dimensional semiconductor memory device of claim 5, wherein
    the first contact plug comprises a first conductive structure and a second conductive structure on the first conductive structure, the first conductive structure of the first contact plug and the second conductive structure of the first contact plug connected to each other in the vertical direction,
    the second contact plug comprises a first conductive structure and a second conductive structure on the first conductive structure, the first conductive structure of the second contact plug and the second conductive structure of the second contact plug connected to each other in the vertical direction,
    the third contact plug comprises a first conductive structure and a second conductive structure on the first conductive structure, the first conductive structure of the third contact plug and the second conductive structure of the third contact plug connected to each other in the vertical direction, and
    a slope of a side surface of the first conductive structure is different from a slope of a side surface of the second conductive structure.

12. The three-dimensional semiconductor memory device of claim 5, further comprising separation patterns between adjacent seed patterns of the first seed pattern, the second seed pattern, and the third seed pattern.

13. A three-dimensional semiconductor memory comprising:
    a first substrate including a first region, a second region extended from the first region in a first direction, and a third region adjacent to the second region in the first direction;
    a peripheral circuit structure including peripheral transistors, which are on the first substrate, and a first insulating layer, which covers the peripheral transistors;

a second substrate on the peripheral circuit structure and extended from the first region to the second region;

a second insulating layer on the peripheral circuit structure on the third region;

a stack structure including interlayer dielectric layers and gate electrodes, which are alternately and repeatedly stacked on the second substrate, the stack structure comprising a first stack structure on the second substrate and a second stack structure on the first stack structure;

a mold structure on a portion of the second region and enclosed by the stack structure;

a seed layer, which covers the first stack structure and the mold structure and is extended in the first direction;

vertical channel structures on the first region, the vertical channel structures penetrating the stack structure and in contact with the second substrate;

a first contact plug on the second region, the first contact plug penetrating the stack structure and connected to one of the gate electrodes;

a second contact plug on the portion of the second region, the second contact plug penetrating the mold structure and electrically connected to one of the peripheral transistors of the peripheral circuit structure;

a third contact plug on the second region in contact with the second substrate; and a fourth contact plug provided on the third region to penetrate the second insulating layer and electrically connected to another one of the peripheral transistors of the peripheral circuit structure, wherein the vertical channel structures and the first contact plug, the second contact plug, the third contact plug and the fourth contact plug have top surfaces located at a same level, wherein an upper width of each of the first contact plug, the second contact plug, the third contact plug, and the fourth contact plug is larger than an upper width of each of the vertical channel structures, and wherein the seed layer includes a first seed pattern enclosing the vertical channel structures and a second seed pattern enclosing each of the first contact plug, the second contact plug, the third contact plug, and the fourth contact plug.

14. The three-dimensional semiconductor memory device of claim 13, wherein each of the first contact plug, the second contact plug, and the fourth contact plug is electrically connected to a separate one of the peripheral transistors of the peripheral circuit structure.

15. The three-dimensional semiconductor memory device of claim 13, wherein each of the vertical channel structures comprises a first vertical channel structure penetrating the first stack structure and a second vertical channel structure penetrating the second stack structure, the first vertical channel structure and the second vertical channel structure are connected to each other in a vertical direction, and a portion of a top surface of the first vertical channel structure is in contact with a bottom surface of the first seed pattern.

16. An electronic system, comprising:

a three-dimensional semiconductor memory device; and a controller electrically connected to the three-dimensional semiconductor memory device and configured to control the three-dimensional semiconductor memory device, wherein the three-dimensional semiconductor memory device includes:

a substrate;

a stack structure including interlayer dielectric layers and gate electrodes, which are alternately and repeatedly stacked on the substrate, the stack structure comprising a first stack structure on the substrate and a second stack structure on the first stack structure;

a seed layer between the first stack structure and the second stack structure and extended in a horizontal direction;

vertical channel structures that penetrate the stack structure and are in contact with the substrate;

contact plugs, wherein each contact plug penetrates the stack structure and is in contact with one of the gate electrodes; and an input/output pad connected to one of the contact plugs, wherein the controller is electrically connected to the three-dimensional semiconductor memory device through the input/output pad, wherein each of the vertical channel structures comprises a first vertical channel structure penetrating the first stack structure and a second vertical channel structure penetrating the second stack structure, wherein the first vertical channel structure and the second vertical channel structure are connected to each other in a vertical direction, wherein the seed layer includes a first seed pattern, which is in contact with a side surface of each of the vertical channel structures, and a second seed pattern, which is in contact with a side surface of each of the contact plugs and is spaced apart from the first seed pattern, and wherein the first seed pattern comprises a first portion, which covers a portion of a top surface of the first vertical channel structure and a second portion, which is extended from the first portion in the horizontal direction.

17. The electronic system of claim 16, wherein the three-dimensional semiconductor memory device further comprises:

a peripheral circuit structure including peripheral transistors on the substrate and first bonding pads connected to the peripheral transistors;

second bonding pads, each second bonding pad being integrally bonded to a separate first bonding pad of the first bonding pads; and conductive lines connected to the second bonding pads, wherein the conductive lines are electrically connected to the vertical channel structures and the contact plugs, and wherein a length of the gate electrodes in the horizontal direction increases with increasing distance from the substrate.

* * * * *